(12) United States Patent
Lee et al.

(10) Patent No.: US 12,230,195 B2
(45) Date of Patent: Feb. 18, 2025

(54) DISPLAY DEVICE AND TILED DISPLAY DEVICE INCLUDING THE SAME

(71) Applicant: Samsung Display Co., LTD., Yongin-si (KR)

(72) Inventors: Kye Uk Lee, Yongin-si (KR); Jung Hwan Hwang, Yongin-si (KR); Ji Youn Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/425,663

(22) Filed: Jan. 29, 2024

(65) Prior Publication Data

US 2024/0265849 A1    Aug. 8, 2024

(30) Foreign Application Priority Data

Feb. 2, 2023  (KR) .................. 10-2023-0014257
Jun. 21, 2023  (KR) .................. 10-2023-0079522

(51) Int. Cl.
| | | |
|---|---|---|
| *H01L 27/12* | (2006.01) | |
| *G09G 3/32* | (2016.01) | |
| *H01L 25/16* | (2023.01) | |

(52) U.S. Cl.
CPC ............. *G09G 3/32* (2013.01); *H01L 25/167* (2013.01); *H01L 27/1255* (2013.01); *G09G 2300/026* (2013.01); *G09G 2300/0426* (2013.01); *G09G 2300/0819* (2013.01); *G09G 2300/0852* (2013.01); *G09G 2310/066* (2013.01); *G09G 2310/08* (2013.01); *H01L 27/124* (2013.01)

(58) Field of Classification Search
None
See application file for complete search history.

(56) References Cited

U.S. PATENT DOCUMENTS

| | | | |
|---|---|---|---|
| 11,100,849 B1* | 8/2021 | Yang .................. | G09G 3/32 |
| 2018/0301080 A1* | 10/2018 | Shigeta ............... | G09G 3/32 |
| 2020/0111403 A1* | 4/2020 | Kim .................... | G09G 3/32 |
| 2020/0111404 A1* | 4/2020 | Kim .................... | G09G 3/2011 |

(Continued)

FOREIGN PATENT DOCUMENTS

| | | |
|---|---|---|
| CN | 113035134 A | 6/2021 |
| CN | 114008779 A | 2/2022 |

(Continued)

*Primary Examiner* — Parul H Gupta
(74) *Attorney, Agent, or Firm* — Lewis Roca Rothgerber Christie LLP

(57) ABSTRACT

A display device includes PWM data lines to receive PWM data voltages, first to third data lines to receive corresponding data voltages from among first to third data voltages, sweep signal lines to receive sweep signals, and a sub-pixel connected to a PWM data line from among the PWM data lines, a data line from among the first to third data lines, and a sweep signal line from among the sweep signal lines, and includes at least one light emitting element. The sub-pixel may include a first transistor, a first capacitor electrode connected to a gate electrode of the first transistor, and a second capacitor electrode connected to the sweep signal line, and overlapping the first capacitor electrode in a thickness direction of the display device. The second capacitor electrode does not overlap a source electrode and a drain electrode of the first transistor in the thickness direction.

25 Claims, 20 Drawing Sheets

(56) References Cited

U.S. PATENT DOCUMENTS

| | | | |
|---|---|---|---|
| 2020/0161407 A1* | 5/2020 | Ka | H01L 29/78648 |
| 2020/0394953 A1* | 12/2020 | Kim | G09G 3/32 |
| 2021/0210002 A1* | 7/2021 | Kim | G09G 3/32 |
| 2021/0366358 A1* | 11/2021 | Li | G11C 19/28 |
| 2022/0223085 A1* | 7/2022 | Chang | G09G 3/20 |
| 2023/0078842 A1* | 3/2023 | Kim | H10K 59/1213 |
| | | | 257/443 |
| 2023/0107775 A1* | 4/2023 | Kim | H03K 17/6871 |
| | | | 345/83 |
| 2023/0119036 A1* | 4/2023 | Hwang | G09G 3/2081 |
| | | | 345/204 |
| 2023/0120477 A1* | 4/2023 | Hwang | G09G 3/2011 |
| | | | 345/76 |
| 2023/0121681 A1* | 4/2023 | Hwang | G09G 3/2014 |
| | | | 345/55 |
| 2023/0124542 A1* | 4/2023 | Hwang | G09G 3/32 |
| | | | 345/204 |
| 2023/0154372 A1* | 5/2023 | Hwang | G09G 3/2011 |
| | | | 345/691 |
| 2023/0186836 A1* | 6/2023 | Jeong | G09G 3/32 |
| | | | 345/55 |
| 2023/0230533 A1* | 7/2023 | Kim | H01L 25/167 |
| | | | 345/211 |
| 2024/0194127 A1* | 6/2024 | Jeon | G09G 3/32 |

FOREIGN PATENT DOCUMENTS

| | | |
|---|---|---|
| KR | 10-2019-0098315 A | 8/2019 |
| KR | 10-2362145 B1 | 2/2022 |

\* cited by examiner

DISPLAY DEVICE AND TILED DISPLAY DEVICE INCLUDING THE SAME

CROSS-REFERENCE TO RELATED APPLICATION

The present application claims priority to and the benefit of Korean Patent Application No. 10-2023-0014257 filed on Feb. 2, 2023, and Korean Patent Application No. 10-2023-0079522 filed on Jun. 21, 2023, in the Korean Intellectual Property Office (KIPO), the entire contents of both of which are incorporated by reference herein.

BACKGROUND

1. Field

One or more embodiments of the present disclosure relate to a display device and a tiled display device including the same.

2. Description of Related Art

With the advance of information-oriented society, more and more demands are placed on display devices for displaying images in various ways. The display device may be a flat panel display device such as a liquid crystal display, a field light emitting display and a light emitting display.

A light emitting display device may include an organic light emitting display device including an organic light emitting diode element as a light emitting element, or a light emitting diode display device including an inorganic light emitting diode element such as a light emitting diode (LED) as a light emitting element.

SUMMARY

Aspects and features of embodiments of the present disclosure provide a display device having improved driving reliability of a light emitting display device and a tiled display device including the same.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provide a display device including PWM data lines configured to receive PWM data voltages, first to third data lines configured to receive corresponding data voltages from among first to third data voltages, sweep signal lines configured to receive sweep signals, and a sub-pixel connected to a PWM data line from among the PWM data lines, a data line from among the first to third data lines, and a sweep signal line from among the sweep signal lines, and includes at least one light emitting element. The sub-pixel may further include a first transistor, a first capacitor electrode connected to a gate electrode of the first transistor, and a second capacitor electrode connected to the sweep signal line, and overlapping the first capacitor electrode in a thickness direction of the display device. The second capacitor electrode does not overlap a source electrode and a drain electrode of the first transistor in the thickness direction of the display device.

The sweep signal may include a pulse that is configured to linearly change from a gate-off voltage to the gate-on voltage for a period.

The sweep signal lines may extend in a first direction. A length of the second capacitor electrode in the first direction may be greater than a length of the first capacitor electrode in the first direction.

A first side of the second capacitor electrode may protrude more than a first side of the first capacitor electrode, and a second side of the second capacitor electrode opposite the first side of the second capacitor electrode protrudes more than a second side of the first capacitor electrode opposite the first side of the first capacitor electrode.

The sweep signal lines may extend in a first direction. A length of the second capacitor electrode in the first direction may be smaller than a length of the first capacitor electrode in the first direction.

The first side of a first capacitor electrode may protrude more than a first side of the second capacitor electrode, and a second side of the first capacitor electrode opposite the first side of the first capacitor electrode may protrude more than a second side of the second capacitor electrode opposite the first side of the second capacitor electrode.

The display device may further include PWM light emitting lines configured to receive PWM light emitting signals. The second capacitor electrode may overlap with one of the PWM light emitting lines in the thickness direction of the display device.

The display device may further include a first gate connection electrode and a second gate connection electrode connected to the PWM light emitting line and spaced from each other. The sweep signal lines may extend in a first direction. The second capacitor electrode may be between the first gate connection electrode and the second gate connection electrode in the first direction.

The sub-pixel may further include a third capacitor electrode connected to a gate electrode of the first transistor and overlapping the second capacitor electrode in the thickness direction of the display device.

The second capacitor electrode may be between the first capacitor electrode and the third capacitor electrode in the thickness direction of the display device.

The sub-pixel may further include may rise a first sub-transistor and a second sub-transistor connecting a gate electrode and a second electrode of the first transistor when a scan write signal is applied. One electrode of the first sub-transistor may be connected to the second capacitor electrode. One electrode of the second sub-transistor may be connected to a first drain electrode of the first transistor.

The sweep signal lines may extend in a first direction. A length of the second capacitor electrode in the first direction may be greater than a length of the third capacitor electrode in the first direction.

A first side of the second capacitor electrode may protrude more than a first side of the third capacitor electrode, and a second side of the second capacitor electrode opposite the first side of the second capacitor electrode may protrude more than a second side of the third capacitor electrode facing the first side.

The sweep signal lines may extend in a first direction. A length of the second capacitor electrode in the first direction may be smaller than a length of the third capacitor electrode in the first direction.

A first side of the third capacitor electrode may protrude more than a first side of the second capacitor electrode. A second side of the third capacitor electrode opposite the first side of the third capacitor electrode may protrude more than a second side of the second capacitor electrode opposite the first side of the second capacitor electrode.

The light emitting element may be a flip chip type micro light emitting diode element.

According to one or more embodiments of the present disclosure, there is provide a display device including PWM data lines configured to receive PWM data voltages, first to third data lines configured to receive corresponding data voltages from among first to third data voltages, sweep signal lines configured to receive sweep signals, and a sub-pixel connected to a PWM data line from among the PWM data lines, a data line from among the first to third data lines, and a sweep signal line from among the sweep signal lines, and includes at least one light emitting element. The sub-pixel further includes a first transistor, a first capacitor electrode connected to a gate electrode of the first transistor, a second capacitor electrode connected to the sweep signal line and overlapping the first capacitor electrode in a thickness direction of the display device, and a third capacitor electrode connected to a gate electrode of the first transistor.

The gate electrode of the first transistor and the first capacitor electrode may be integrally formed.

The second capacitor electrode may not overlap a source electrode and a drain electrode of the first transistor in the thickness direction of the display device.

According to one or more embodiments of the present disclosure, there is provide a tiled display device including a plurality of display devices, and a connection member between the plurality of display devices. One display device from among the plurality of display devices includes PWM data lines configured to receive PWM data voltages, first to third data lines configured to receive corresponding data voltages from among first to third data voltages, sweep signal lines configured to receive sweep signals, and a sub-pixel connected to a PWM data line from among the PWM data lines, a data line from among the first to third data lines, and a sweep signal line from among the sweep signal lines, and includes at least one light emitting element. The sub-pixel includes a first transistor, a first capacitor electrode connected to a gate electrode of the first transistor, and a second capacitor electrode connected to the sweep signal line, and overlapping the first capacitor electrode in a thickness direction of the display device. The second capacitor electrode does not overlap a source electrode and a drain electrode of the first transistor in the thickness direction of the display device.

The light emitting element may be a flip chip type micro light emitting diode element.

The substrate may include glass.

The display device may further include a side wiring on a first surface of the substrate, a second surface opposite to the first surface, and a side surface between the first surface and the second surface.

The display device may further include a connection line on a second surface of the substrate and connected to the side wiring, and a flexible film connected to the connection line through a conductive adhesive member.

The plurality of display devices may be arranged in a matrix form in M rows and N columns.

According to the aforementioned and other embodiments of the present disclosure, a second capacitor electrode may not overlap with a first source electrode and a first drain electrode of a first transistor. Accordingly, since the overlap area between the second capacitor electrode and the first source electrode may be eliminated, the capacity of the first parasitic capacitor between the second capacitor electrode and the first source electrode may be significantly reduced.

Also, since the overlap area between the second capacitor electrode and the first drain electrode may be eliminated, the capacity of the second capacitor between the second capacitor electrode and the first drain electrode may be significantly reduced. Therefore, the amount of voltage change in a sweep signal line by the first parasitic capacitor and the second parasitic capacitor may be reduced or prevented from being reflected on the first source electrode and the first drain electrode of the first transistor.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
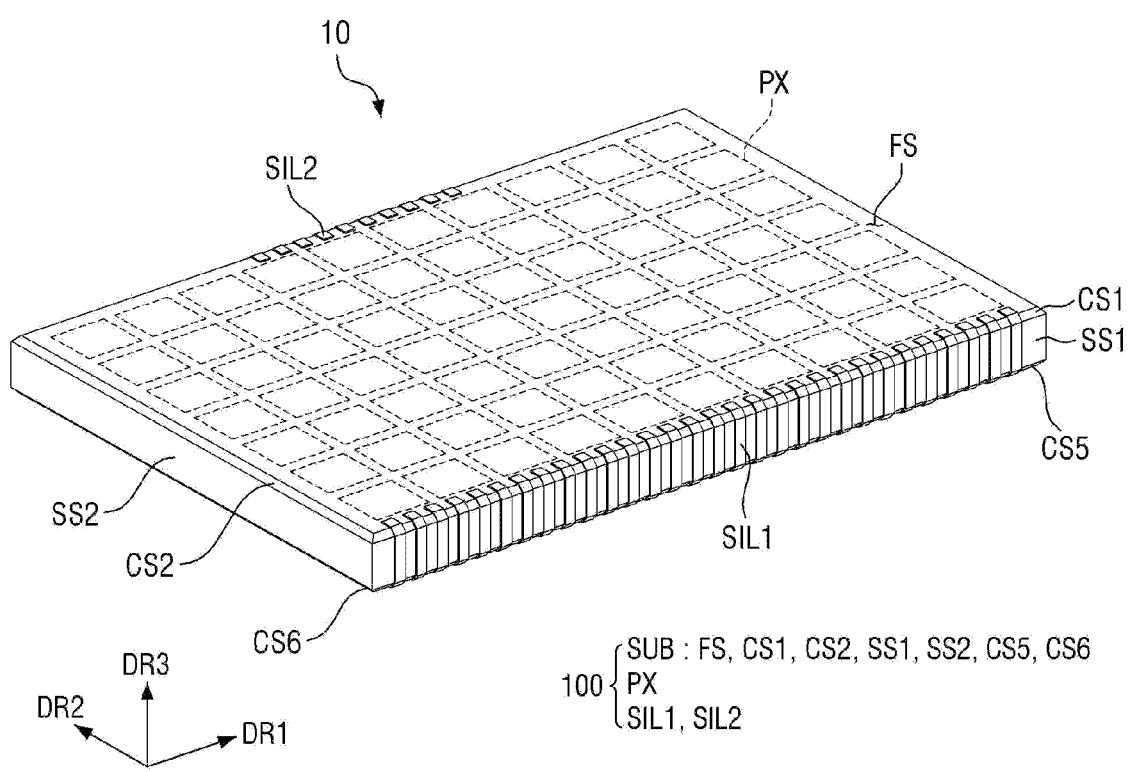
FIGS. 1 and 2 are perspective views illustrating a display device according to one or more embodiments.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that the present disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "in a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of the present disclosure, expressions such as "at least one of," "one of," and "selected from," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, XZ, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B. Further, the use of "may" when describing embodiments of the present disclosure refers to "one or more embodiments of the present disclosure".

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, for example, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to one or more embodiments of the present disclosure described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning for example consistent with their meaning in the context of the relevant art and/or the present specification, and should not be interpreted in an idealized or overly formal sense, unless expressly so defined herein.

Figure 2:
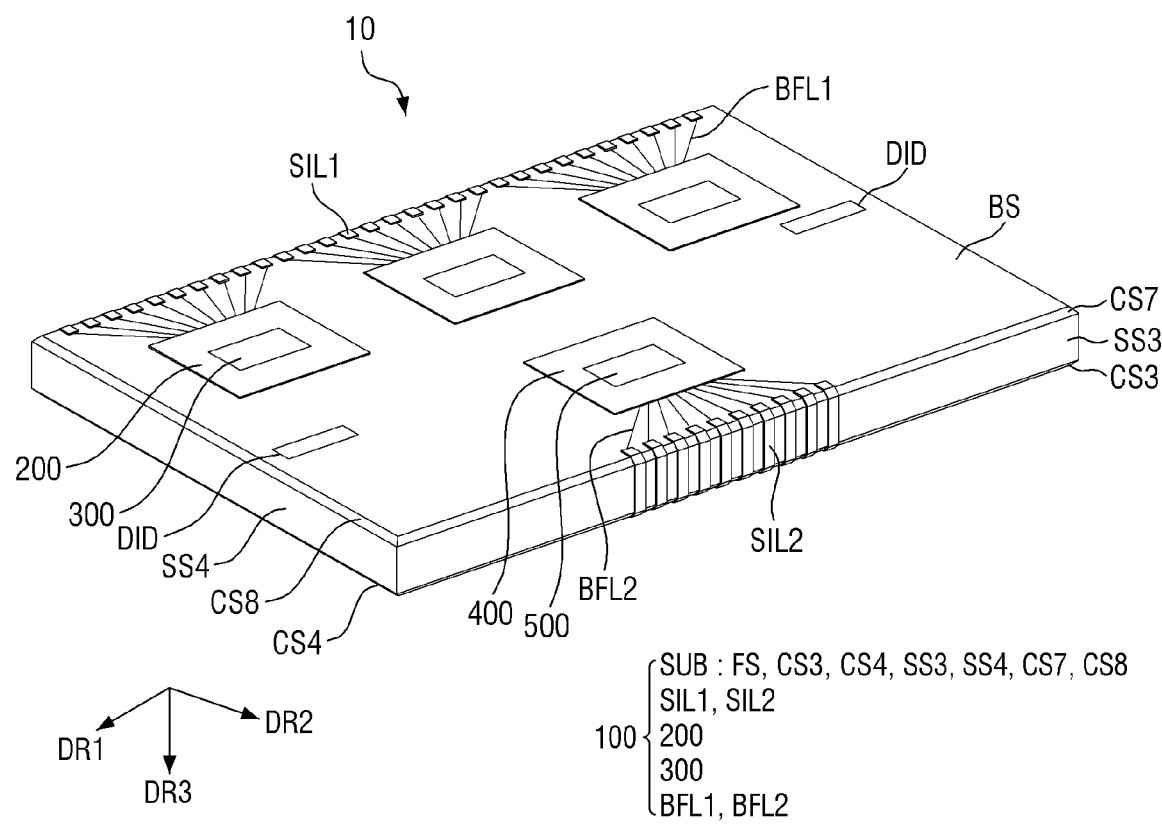

FIGS. 1 and 2 are perspective views illustrating a display device according to one or more embodiments.

Referring to FIGS. 1 and 2, a display device 10 is a device for displaying a moving image or a still image. The display device may be used as a display screen of various products such as televisions, laptop computers, monitors, billboards and the Internet of Things (IOT) as well as portable electronic devices such as mobile phones, smart phones, tablet personal computer (tablet PC), smart watches, watch phones, mobile communication terminals, electronic notebooks, electronic books, portable multimedia players (PMPs), navigation systems and ultra mobile PCs (UMPCs).

The display device 10 according to one or more embodiments may include a display panel 100, a circuit board 200, and a source driving circuit 300.

The display panel 100 may include a substrate SUB, first bottom fan-out wirings BFL1, second bottom fan-out wirings BFL2, a plurality of pixels PX, a plurality of first side wirings SIL1, a plurality of second side wirings SIL2, and a plurality of device identifiers DID.

The substrate SUB may include a first surface FS, a second surface BS, a plurality of chamfered surfaces CS1 to CS8, and a plurality of side surfaces SS1 to SS8.

The first surface FS may be the front surface of the substrate SUB. The first surface FS may have a rectangular shape having a long side in the first direction DR1 and a short side in the second direction DR2.

The second surface BS may be a surface opposite the first surface FS. The second surface BS may be a rear surface of the substrate SUB. The second surface BS may have a rectangular shape having a long side in the first direction DR1 and a short side in the second direction DR2. The second surface BS may be a surface opposite the first surface FS.

The plurality of chamfered surfaces CS1 to CS8 refer to obliquely cut surfaces disposed between the first surface FS and the plurality of side surfaces SS1 to SS8 and between the second surface BS and the plurality of side surfaces SS1 to SS8 to prevent a chipping defect from occurring in the plurality of first side wirings SIL1 and the plurality of second side wirings SIL2. Because each of the plurality of first side wirings SIL1 and the plurality of second side wirings SIL2 may have a gentle bending angle due to the plurality of chamfered surfaces CS1 to CS8, chipping or cracking of the plurality of first side wirings SIL1 and the plurality of second side wirings SIL2 may be prevented.

The first chamfered surface CS1 may be extended from the first side of the first surface FS, for example, the lower side. The second chamfered surface CS2 may be extended from the second side of the first surface FS, for example, the left side. The third chamfered surface CS3 may be extended from the third side of the first surface FS, for example, the upper side. The fourth chamfered surface CS4 may be extended from the fourth side of the first surface FS, for example, the right side. An interior angle formed by the first surface FS and the first chamfered surface CS1, an interior angle formed by the first surface FS and the second chamfered surface CS2, an interior angle formed by the first surface FS and the third chamfered surface CS3, and an interior angle formed by the first surface FS and the fourth chamfered surface CS4 may be greater than 90 degrees.

The fifth chamfered surface CS5 may be extended from the first side of the second surface BS, for example, the lower side. The sixth chamfered surface CS6 may be extended from the second side of the second surface BS, for example, the left side. The seventh chamfered surface CS7 may be extended from the third side of the second surface BS, for example, the upper side. The eighth chamfered surface CS8 may be extended from the fourth side of the second surface BS, for example, the right side. An interior angle formed by the second surface BS and the fifth chamfered surface CS5, an interior angle formed by the second surface BS and the sixth chamfered surface CS6, an interior angle formed by the second surface BS and the seventh chamfered surface CS7, and an interior angle formed by the second surface BS and the eighth chamfered surface CS8 may be greater than 90 degrees.

The first side surface SS1 may be extended from the first chamfered surface CS1. The first chamfered surface CS1 may be disposed between the first surface FS and the first side surface SS1. The first side surface SS1 may be a lower surface of the substrate SUB.

The second side surface SS2 may be extended from the second chamfered surface CS2. The second chamfered surface CS2 may be disposed between the first surface FS and the second side surface SS2. The second side surface SS2 may be the left side of the substrate SUB.

The third side surface SS3 may be extended from the third chamfered surface CS3. The third chamfered surface CS3 may be disposed between the first surface FS and the third side surface SS3. The third side surface SS3 may be an upper surface of the substrate SUB.

The fourth side surface SS4 may be extended from the fourth chamfered surface CS4. The fourth chamfered surface CS4 may be disposed between the first surface FS and the fourth side surface SS4. The fourth side surface SS4 may be the right side of the substrate SUB.

The plurality of pixels PX may be disposed on the first surface FS of the substrate SUB to display an image. The plurality of pixels PX may be arranged in a matrix form along the first and second directions DR1 and DR2. For example, the plurality of pixels PX may be arranged along rows and columns of a matrix along the first and second directions DR1 and DR2. A description of the plurality of pixels PX will be described later with reference to FIG. 3.

The plurality of first side wirings SIL1 may be disposed on at least one side surface of at least two chamfered surfaces from among the first surface FS, the second surface BS, and the plurality of chamfered surfaces CS1 to CS8 and may be disposed on at least one of the plurality of side surfaces SS1 to SS4. For example, the plurality of first side wirings SIL1 may be disposed on the first surface FS, the second surface BS, the first chamfered surface CS1, the fifth chamfered surface CS5, and the first side surface SS1 to connect the first pads disposed on the first side of the first surface FS and the first bottom fan-out wirings BFL1 of the second surface BS.

The plurality of second side wirings SIL2 may be disposed on at least one side surface of at least two chamfered surfaces from among the first surface FS, the second surface BS, and the plurality of chamfered surfaces CS1 to CS8 and may be disposed on at least one of the plurality of side surfaces SS1 to SS4. For example, the plurality of second side wirings SIL2 may be disposed on the first surface FS, the second surface BS, the third chamfered surface CS3, the seventh chamfered surface CS7, and the third side surface SS3 to connect the second pads disposed on the second side opposite to the first side of the first surface FS and the second bottom fan-out wirings BFL2 of the second surface BS.

Each of the plurality of first side wirings SIL1 connects the first pads disposed on the first surface FS and the first bottom fan-out wirings BFL1 disposed on the second surface BS. Each of the plurality of second side wirings SIL2 connects the second pads disposed on the first surface FS and the second bottom fan-out wirings BFL2 disposed on the second surface BS. The first pads and the second pads may correspond to front pads. The first pads may be connected to data lines connected to the pixels PX of the substrate SUB. Some of the second pads may be connected to the first power supply line disposed on the first surface FS of the substrate SUB, and another part may be connected to the global power supply line disposed on the first surface FS of the substrate SUB.

Each of the plurality of device identifiers DID may be an identification such as an identification number assigned to each display device 10 to distinguish the display device 10. The plurality of device identifiers DID may be disposed on the second surface BS of the substrate SUB. When viewed on a plane, the plurality of device identifiers DID may be disposed to be spaced from the first bottom fan-out wirings BFL1, the second bottom fan-out wirings BFL2, the plurality of first side wirings SIL1, and the plurality of second side wirings SIL2. Also, the plurality of device identifiers DID may be spaced from the plurality of first circuit boards 200 and the second circuit board 400 when viewed on a plane. That is, the plurality of device identifiers DID may be in an electrically floating state.

Some of the plurality of device identifiers DID may be disposed adjacent to the second chamfered surface CS2 and others may be disposed adjacent to the fourth chamfered surface CS4. Some of the plurality of device identifiers DID may be disposed closer to the first chamfer surface CS1 than others. Also, some of the plurality of device identifiers DID may be disposed adjacent to the third chamfer surface CS3 compared to some above.

The plurality of device identifiers DID may be a rear metal layer formed of the same material as the first bottom fan-out wirings BFL1 and the second bottom fan-out wirings BFL2 by the same process. For example, the rear metal layer may be formed as a single layer or multiple layers made of one or more of molybdenum (Mo), aluminum (Al), chromium (Cr), gold (Au), titanium (Ti), nickel (Ni), neodymium (Nd) and/or copper (Cu) and/or an alloy thereof.

A plurality of first circuit boards 200 may be disposed on the second surface BS of the substrate SUB. Each of the plurality of first circuit boards 200 may be connected to the first bottom fan-out wirings BFL1 disposed on the second surface BS of the substrate SUB by using a conductive adhesive member such as an anisotropic conductive film. The plurality of first circuit boards 200 may be electrically connected to the plurality of first side wirings SIL1 through the first bottom fan-out wirings BFL1. The plurality of first circuit boards 200 may be flexible printed circuit boards, printed circuit boards, and/or flexible films.

A second circuit board 400 may be disposed on the second surface BS of the substrate SUB. The second circuit board 400 may be connected to the second bottom fan-out wirings BFL2 disposed on the second surface BS of the substrate SUB by using the conductive adhesive member. The second circuit board 400 may be electrically connected to the plurality of second side wirings SIL2 through the second bottom fan-out wirings BFL2. The second circuit board 400 may be the flexible printed circuit board, the printed circuit board, or the flexible film.

Each of the source driving circuits 300 may generate data voltages and supply them to data lines through the first circuit board 200, the first bottom fan-out wirings BFL1, and the plurality of first side wirings SIL1. Each of the source driving circuits 300 may be formed as an integrated circuit (IC) and attached to a corresponding circuit board 200. Alternatively, the source driving circuit 300 may be directly attached to the second surface BS of the substrate SUB using a chip on glass (COG) method.

A power supply circuit 500 may generate and supply suitable voltages (e.g., predetermined voltages) to voltage lines (e.g., predetermined voltage lines) through the second circuit board 400, the second bottom fan-out wirings BFL2, and the plurality of second side wirings SIL2. For example, the power supply circuit 500 may generate a first power voltage and supply it to the first power line through the second circuit board 400, the second bottom fan-out wirings BFL2, and the plurality of second side wirings SIL2. In addition, the power supply circuit 500 may generate a global power voltage GV and supply it to the global power line through the second circuit board 400, the second bottom fan-out wirings BFL2, and the plurality of second side wirings SIL2. The power supply circuit 500 may be formed as the integrated circuit (IC) and attached to the second circuit board 400. Alternatively, the power supply circuit 500 may be directly attached to the second surface BS of the substrate SUB using the chip on glass (COG) method.

As shown in FIGS. 1 and 2, the flexible film bent along the side surface of the substrate SUB may be removed by using the plurality of first side wirings SIL1 and the plurality of second side wirings SIL2. As a result, a bezel-less display device may be implemented.

Figure 3:
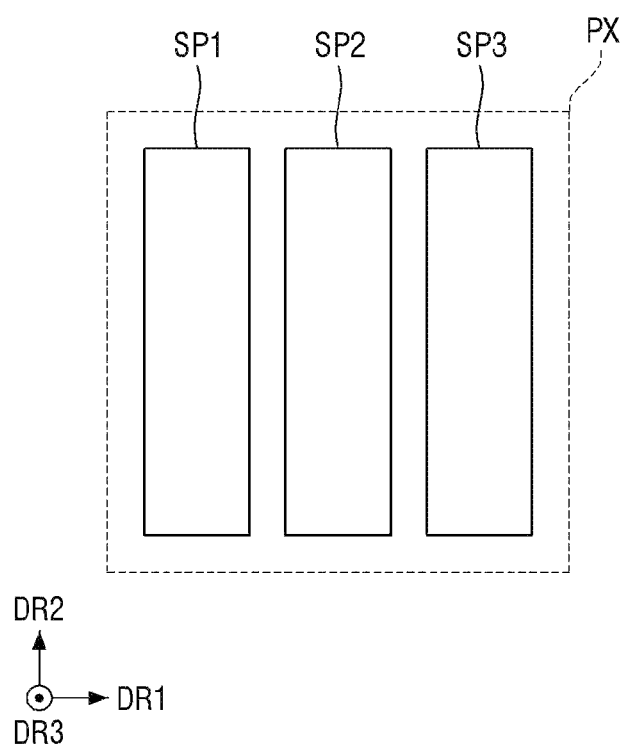
FIG. 3 is a layout view illustrating first to third sub-pixels of a pixel of a display device according to one or more embodiments.

FIG. 3 is a layout view illustrating first to third sub-pixels of a pixel of a display device according to one or more embodiments.

Referring to FIG. 3, each of the pixels PX may include a plurality of sub-pixels SP1, SP2, and SP3. In FIG. 3, it is exemplified that each of the pixels PX includes three sub-pixels SP1, SP2, and SP3, that is, a first sub-pixel SP1, a second sub-pixel SP2, and a third sub-pixel SP3 but the present disclosure is not limited thereto. Each of the first sub-pixel SP1, the second sub-pixel SP2, and the third sub-pixel SP3 may be connected to at least one of the PWM data lines DL, at least one of the first to third data lines RDL, GDL, and BDL, and at least one of the scan lines GWL, GIL, GCL, SWPL, PAEL, and PWEL.

Each of the first sub-pixel SP1, the second sub-pixel SP2, and the third sub-pixel SP3 may have a rectangular, square, or rhombus planar shape. For example, each of the first sub-pixel SP1, the second sub-pixel SP2, and the third sub-pixel SP3 may have a rectangular planar shape having a short side in the first direction DR1 and a long side in the second direction DR2. Alternatively, each of the first sub-pixel SP1, the second sub-pixel SP2, and the third sub-pixel SP3 may have a planar shape of a square or rhombus including sides having the same length in the first direction DR1 and the second direction DR2.

As shown in FIG. 3, the first sub-pixel SP1, the second sub-pixel SP2, and the third sub-pixel SP3 may be arranged along the first direction DR1. Alternatively, one of the second sub-pixel SP2 and the third sub-pixel SP3 and the first sub-pixel SP1 may be arranged in the first direction DR1, and the other one and the first sub-pixel SP1 may be arranged in the second direction DR2. For example, the first sub-pixel SP1 and the second sub-pixel SP2 may be arranged along the first direction DR1, and the first sub-pixel SP1 and the third sub-pixel SP3 may be arranged along the second direction DR2. Alternatively, one of the first sub-pixel SP1 and the third sub-pixel SP3 and the second sub-pixel SP2 may be arranged along the first direction DR1, and the other one and the third sub-pixel SP3 may be arranged along the second direction DR2.

The first sub-pixel SP1 may emit first light, the second sub-pixel SP2 may emit second light, and the third sub-pixel SP3 may emit third light. Here, the first light may be light in a red wavelength band, the second light may be light in a green wavelength band, and the third light may be light in a blue wavelength band. The red wavelength band may be a wavelength band of approximately 600 nm to 750 nm, the green wavelength band may be a wavelength band of approximately 480 nm to 560 nm, and the blue wavelength band may be a wavelength band of approximately 370 nm to 460 nm, but the present disclosure is not limited thereto.

Each of the first sub-pixel SP1, the second sub-pixel SP2, and the third sub-pixel SP3 may include an inorganic light emitting element having an inorganic semiconductor as a light emitting element emitting light. For example, the inorganic light emitting element may be a flip chip type micro light emitting diode (LED), but the present disclosure is not limited thereto.

As shown in FIG. 3, the area of the first sub-pixel SP1, the area of the second sub-pixel SP2, and the area of the third sub-pixel SP3 may be substantially the same, but the present disclosure is not limited thereto. At least one of the area of the first sub-pixel SP1, the area of the second sub-pixel SP2, and the area of the third sub-pixel SP3 may be different from the other one. Alternatively, any two of the area of the first sub-pixel SP1, the area of the second sub-pixel SP2, and the area of the third sub-pixel SP3 may be substantially the same and the other one may be different from the above two. Alternatively, the area of the first sub-pixel SP1, the area of the second sub-pixel SP2, and the area of the third sub-pixel SP3 may be different from each other.

Figure 4:
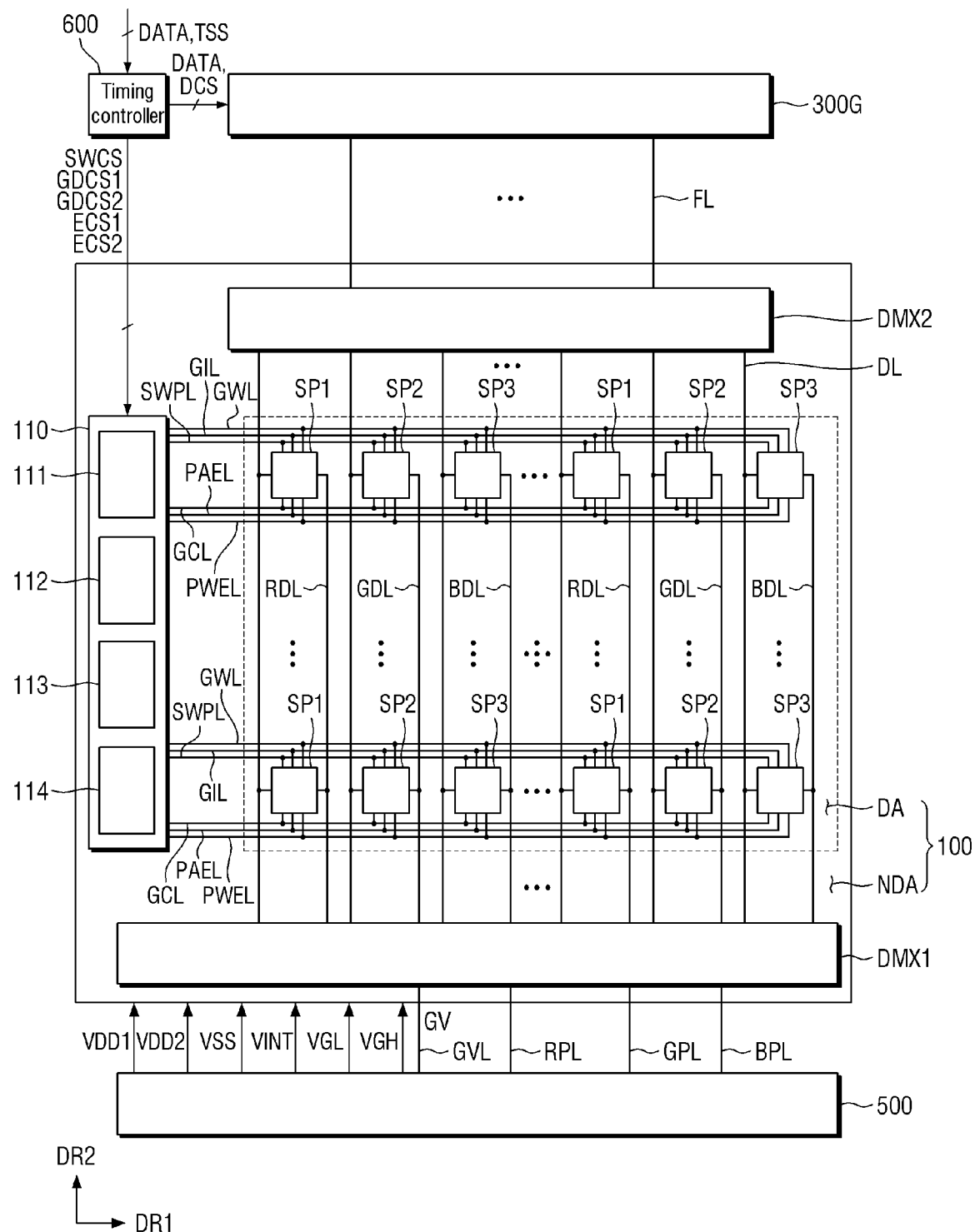
FIG. 4 is a block view illustrating a display device according to one or more embodiments.

FIG. 4 is a block view illustrating a display device according to one or more embodiments.

Referring to FIG. 4, the display device 10 includes a display panel 100, a scan driving circuit 110, a data driving circuit 300G, a timing control circuit 600, and a power supply circuit 500.

A display area DA of the display panel 100 may include sub-pixels SP1, SP2, and SP3 displaying an image, scan write lines GWL connected to the sub-pixels SP1, SP2, and SP3, scan initialization lines GIL, scan control lines GCL, sweep signal lines SWPL, PWM light emitting lines PWEL, PAM light emitting lines PAEL, PWM data lines DL, first data lines RDL, second data lines GDL, and third data lines BDL.

The scan write lines GWL, scan initialization lines GIL, scan control lines GCL, sweep signal lines SWPL, PWM light emitting lines PWEL, and PAM light emitting lines PAEL may be extended in the first direction (X-axis direction) and may be disposed in the second direction (Y-axis direction) crossing the first direction (X-axis direction). The PWM data lines DL, the first data lines RDL, the second data lines GDL, and the third data lines BDL may be extended in the second direction (Y-axis direction) and may be extended in the first direction (X-axis direction). The first data lines RDL may be electrically connected to each other, the second data lines GDL may be electrically connected to each other, and the third data lines BDL may be electrically connected to each other.

The sub-pixels SP1, SP2, and SP3 may include first sub-pixels SP1 emitting a first light, second sub-pixels SP2 emitting a second light, and third sub-pixels SP3 emitting a third light. The first light indicates light in a red wavelength band, the second light indicates light in a green wavelength band, and the third light indicates light in a blue wavelength band. For example, the main peak wavelength of the first light may be located approximately 600 nm to 750 nm, the main peak wavelength of the second light may be located approximately 480 nm to 560 nm, and the main peak wavelength of the third light may be located approximately 370 nm to 460 nm.

Each of the sub-pixels SP1, SP2, and SP3 may be connected to one of the scan write lines GWL, one of the scan initialization lines GIL, one of the scan control lines GCL, one of the sweep signal lines SWPL, one of the PWM light emitting lines PWEL, and one of the PAM light emitting lines PAEL. Also, each of the first sub-pixels SP1 may be connected to one of the PWM data lines DL and one of the first data lines RDL, each of the second sub-pixels SP2 may be connected to one of the PWM data lines DL and one of the second data lines GDL, and each of the third sub-pixels SP3 may be connected to one of the PWM data lines DL and one of the third data lines BDL.

A non-display area NDA of the display panel 100 may include a scan driving circuit 110, a first demultiplexer DMX1, and a second demultiplexer DMX2.

The scan driving circuit 110 may be disposed on the display panel 100 to apply signals to scan write lines GWL, scan initialization lines GIL, scan control lines GCL, sweep signal lines SWPL, the PWM light emitting lines PWEL, and the PAM light emitting lines PAEL. FIG. 4 illustrates that the scan driving circuit 110 is disposed at one edge of the display panel 100 but is not limited thereto. The scan driving circuit 110 may be disposed on both edges of the display panel 100.

The scan driving circuit 110 may include a first scan signal driving circuit 111, a second scan signal driving circuit 112, a sweep signal driving circuit 113, and a light emitting signal driving circuit 114.

The first scan signal driving circuit 111 may receive a first scan driving control signal GDCS1 from the timing control circuit 600. The first scan signal driving circuit 111 may output scan initialization signals to scan initialization lines GIL and scan write signals to scan write lines GWL according to the first scan driving control signal GDCS1. That is, the first scan signal driving circuit 111 may output two scan signals, that is, scan initialization signals and scan write signals together.

The second scan signal driving circuit 112 may receive the second scan driving control signal GDCS2 from the timing control circuit 600. The second scan signal driving circuit 112 may output scan control signals to the scan control lines GCL according to the second scan driving control signal GDCS2.

The sweep signal driving circuit 113 may receive a first light emitting control signal ECS1 and a sweep control signal SWCS from the timing control circuit 600. The sweep signal driving circuit 113 may output PWM light emitting signals to the PWM light emitting lines PWEL and output sweep signals to the sweep signal lines SWPL according to the first light emitting control signal ECS1. That is, the sweep signal driving circuit 113 may output PWM light emitting signals and sweep signals together.

The light emitting signal driving circuit 114 may receive a second light emitting control signal ECS2 from the timing control circuit 600. The light emitting signal driving circuit 114 may output PAM light emitting signals to the PAM light emitting lines PAEL according to the second light emitting control signal ECS2.

The first demultiplexer DMX1 switches the connection between each PWM data line DL and the global power supply line GVL. In addition, the first demultiplexer DMX1 switches the connection between each first data line RDL and a first data voltage line RPL, switches the connection between each second data line GDL and the second data voltage line GPL, and switches the connection between each third data line BDL and the third data voltage line BPL.

The second demultiplexer DMX2 may be disposed between the fan-out wirings FL and the PWM data lines DL. The second demultiplexer DMX2 may distribute the PWM data voltages applied to each fan-out line FL to Q (Q is an integer greater than or equal to 2) PWM data lines DL or Q first to third data lines RDL, GDL, and BDL.

The first demultiplexer DMX1 may be disposed adjacent to the second pads, and the second demux unit DMX2 may be disposed adjacent to the first pads. That is, the first demultiplexer DMX1 may be disposed adjacent to one side of the display panel 100, for example, a lower side of the display panel 100. The second demultiplexer DMX2 may be disposed adjacent to the other side of the display panel 100, for example, an upper side of the display panel 100.

The timing control circuit 600 receives digital video data DATA and timing signals TSS. The timing control circuit 600 may generate the first scan driving control signal GDCS1, a second scan driving control signal GDSC2, the first light emitting control signal ECS1, the second light emitting control signal ECS2, and a sweep control signal SWCS for controlling the operation timing of the scan driving circuit 110 according to the timing signals TSS. Also, the timing control circuit 600 may generate a source control signal DCS for controlling the operation timing of the data driving circuit 300G.

The timing control circuit 600 outputs the first scan driving control signal GDCS1, the second scan driving control signal GDSC2, the first light emitting control signal ECS1, the second light emitting control signal ECS2, and the sweep control signal SWCS to the scan driving circuit 110. The timing control circuit 600 outputs the digital video data DATA and the source control signal DCS to the data driving circuit 300G.

The data driving circuit 300G may include a plurality of source driving circuits 300. The data driving circuit 300G converts the digital video data DATA into analog PWM data voltages and outputs them to the fan-out wirings FL.

The power supply circuit 500 may generate and output a first data voltage to the first data voltage line RPL, may generate and output a second data voltage to the second data voltage line GPL, and may generate and output a third data voltage to the third data voltage line BPL. The power supply circuit 500 may generate and output the global power voltage GV to the global power supply line GVL.

In addition, the power supply circuit 500 may generate and output a plurality of power voltages to the display panel 100. For example, the power supply circuit 500 may output a first power voltage VDD1, a second power supply voltage VDD2, a third power voltage VSS, an initialization voltage VINT, a gate-on voltage VGL, and a gate-off voltage VGH to the display panel 100. The first power voltage VDD1 and the second power supply voltage VDD2 may be high potential driving voltages for driving light emitting elements of each of the sub-pixels SP1, SP2, and SP3. The third power voltage VSS may be a low potential driving voltage for driving light emitting elements of each of the sub-pixels SP1, SP2, and SP3. The initialization voltage VINT and the gate-off voltage VGH are applied to each of the sub-pixels SP1, SP2, and SP3, and the gate-on voltage VGL and the gate-off voltage VGH may be applied to the scan driving circuit 110.

Figure 5:
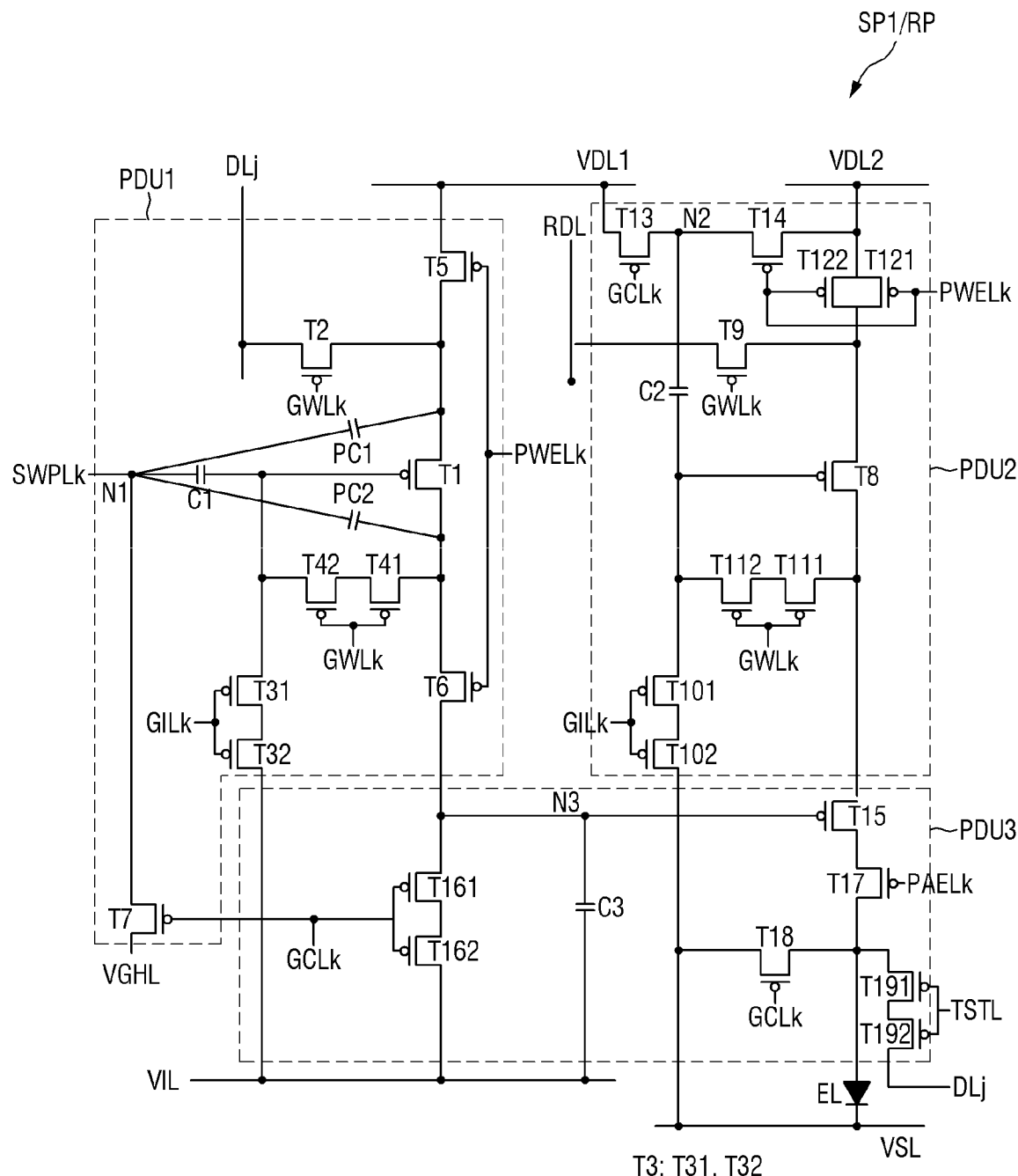
FIG. 5 is an equivalent circuit view illustrating a first sub-pixel according to one or more embodiments.

FIG. 5 is an equivalent circuit view illustrating a first sub-pixel according to one or more embodiments.

Referring to FIG. 5, the first sub-pixel SP1 (e.g., a red color pixel RP) according to one or more embodiments may be connected to a $k^{th}$ scan write line GWLk, a $k^{th}$ scan initialization line GILk, a $k^{th}$ scan control line GCLk, a $k^{th}$ sweep signal line SWPLk, a $k^{th}$ PWM light emitting line PWELk, and a $k^{th}$ PAM light emitting line PAELk. Also, the first sub-pixel SP1 may be connected to the $j^{th}$ PWM data line DLj and the first data line RDL. In addition, the first sub-pixel SP1 may be connected to the first power supply line VDL1 to which the first power voltage VDD1 is applied, the second power supply line VDL2 to which the second power supply voltage VDD2 is applied, a third power supply line VSL to which a third power supply voltage VSS is applied, an initialization voltage line VIL to which an initialization voltage VINT is applied, and a gate-off voltage line VGHL to which the gate-off voltage VGH is applied. In one or more embodiments, the $j^{th}$ PWM data line DLj may be referred to as a first data line, and the first data line RDL may be referred to as a second data line for convenience of description.

The first sub-pixel SP1 may include a light emitting element EL, a first pixel driving unit PDU1, a second pixel driving unit PDU2, and a third pixel driving unit PDU3.

The light emitting element EL emits light according to a driving current generated by the second pixel driving unit PDU2. The light emitting element EL may be disposed between the seventeenth transistor T17 and the third power supply line VSL. A first electrode of the light emitting element EL may be connected to the second electrode of the seventeenth transistor T17 and the second electrode may be connected to the third power supply line VSL. The first electrode of the light emitting element EL may be an anode electrode, and the second electrode may be a cathode electrode. A light emitting element EL may be an inorganic light emitting element including the first electrode, the second electrode, and the inorganic semiconductor disposed between the first electrode and the second electrode. For example, the light emitting element EL may be a micro light emitting diode formed of the inorganic semiconductor but is not limited thereto.

The first pixel driving unit PDU1 generates a control current according to the $j^{th}$ PWM data voltage of the $j^{th}$ PWM data line DLj to control a voltage of a third node N3 of the third pixel driving unit PDU3. Because a pulse width of the first driving current flowing through the light emitting element EL may be adjusted by the control current of the first pixel driving unit PDU1, the first pixel driving unit PDU1 may be a pulse width modulation PWM unit for performing pulse width modulation of the first driving current flowing through the light emitting element EL.

The first pixel driving unit PDU1 may include the first to seventh transistors T1 to T7 and a first capacitor C1.

The first transistor T1 controls the control current flowing between the first electrode and the second electrode according to the PWM data voltage applied to a gate electrode of the first transistor T1.

The second transistor T2 is turned-on by a $k^{th}$ scan write signal of a $k^{th}$ scan write line GWLk to supply the PWM data voltage of the $j^{th}$ PWM data line DLj to the first electrode of the first transistor T1. The gate electrode of the second transistor T2 may be connected to the $k^{th}$ scan write line GWLk, the first electrode may be connected to the $j^{th}$ PWM data line DLj, and the second electrode may be connected to the first electrode of the first transistor T1.

The third transistor T3 is turned-on by a $k^{th}$ scan initialization signal of the $k^{th}$ scan initialization line GILk to connect the initialization voltage line VIL to the gate electrode of the first transistor T1. In this case, the gate-on voltage VGL of the $k^{th}$ scan initialization signal may be different from the initialization voltage VINT of the initialization voltage line VIL. Especially, because the difference voltage between the gate-on voltage VGL and the initialization voltage VINT is greater than the threshold voltage of the third transistor T3, the third transistor T3 may be stably turned-on even after the initialization voltage VINT is applied to the gate electrode of the first transistor T1. Accordingly, when the third transistor T3 is turned-on, the initialization voltage VINT may be stably applied to the gate electrode of the first transistor T1 regardless of the threshold voltage of the third transistor T3.

The third transistor T3 may include a plurality of transistors connected in series. For example, the third transistor T3 may include a first sub-transistor T31 and a second sub-transistor T32. Accordingly, it is possible to reduce the voltage of the gate electrode of the first transistor T1 from leaking through the third transistor T3.

The gate electrode of the first sub-transistor T31 may be connected to the $k^{th}$ scan initialization line GILk, the first electrode may be connected to the gate electrode of the first transistor T1, and the second electrode may be connected to the first electrode of the second sub-transistor T32. The gate electrode of the second sub-transistor T32 may be connected to the $k^{th}$ scan initialization line GILk, the first electrode may be connected to the second electrode of the first sub-transistor T31, and the second electrode may be connected to the initialization voltage line VIL.

The fourth transistor T4 is turned-on by the $k^{th}$ scan write signal of the $k^{th}$ scan write line GWLk to connect the gate electrode to the second electrode of the first transistor T1. Accordingly, the first transistor T1 may operate as a diode (e.g., the first transistor T1 may be diode-connected) while the fourth transistor T4 is turned-on.

The fourth transistor T4 may include a plurality of transistors connected in series. For example, the fourth transistor T4 may include a third sub-transistor T41 and a fourth sub-transistor T42. Accordingly, it is possible to reduce the voltage of the gate electrode of the first transistor T1 from leaking through the fourth transistor T4.

The gate electrode of the third sub-transistor T41 may be connected to the $k^{th}$ scan write line GWLk, the first electrode may be connected to the second electrode of the first transistor T1, and the second electrode may be connected to the first electrode of the fourth sub transistor T42. The gate electrode of the fourth sub-transistor T42 may be connected to the $k^{th}$ scan write line GWLk, the first electrode may be connected to the second electrode of the third sub-transistor T41, and the second electrode may be connected to the gate electrode of the first transistor T1.

The fifth transistor T5 is turned-on by the $k^{th}$ PWM light emitting signal of the $k^{th}$ PWM light emitting line PWELk to connect the first electrode of the first transistor T1 to the first power supply line VDL1. The gate electrode of the fifth transistor T5 may be connected to the $k^{th}$ PWM light emitting line PWELk, the first electrode may be connected to the first power supply line VDL1, and the second electrode may be connected to the first electrode of the first transistor T1.

The sixth transistor T6 is turned-on by the $k^{th}$ PWM light emitting signal of the $k^{th}$ PWM light emitting line PWELk to connect the second electrode of the first transistor T1 to the third node N3 of the third pixel driving unit PDU3. The gate electrode of the sixth transistor T6 may be connected to the $k^{th}$ PWM light emitting line PWELk, the first electrode may be connected to the second electrode of the first transistor T1, and the second electrode may be connected to the third node N3 of the third pixel driving unit PDU3.

The seventh transistor T7 is turned-on by the $k^{th}$ scan control signal of the $k^{th}$ scan control line GCLk to supply the gate-off voltage VGH of the gate-off voltage line VGHL to the first node N1 connected to the $k^{th}$ sweep signal line SWPLk. Accordingly, a voltage change of the gate electrode of the first transistor T1 may be prevented from being reflected to the $k^{th}$ sweep signal of the $k^{th}$ sweep signal line SWPLk by the first capacitor C1 during the period in which the initialization voltage VINT is applied to the gate electrode of the first transistor T1 and the period in which the PWM data voltage of the $j^{th}$ PWM data line DLj and the threshold voltage of the first transistor T1 are programmed. The gate electrode of the seventh transistor T7 may be connected to the $k^{th}$ scan control line GCLk, the first electrode may be connected to the gate-off voltage line VGHL, and the second electrode may be connected to the first node N1.

The first capacitor C1 may be disposed between the gate electrode of the first transistor T1 and the first node N1. One electrode of the first capacitor C1 may be connected to the gate electrode of the first transistor T1, and the other electrode may be connected to the first node N1.

The first node N1 may be a contact point of the $k^{th}$ sweep signal line SWPLk, the second electrode of the seventh transistor T7, and the other electrode of the first capacitor C1.

The second pixel driving unit PDU2 generates the driving current applied to the light emitting element EL according to the first PWM data voltage of the first data line RDL. The second pixel driving unit PDU2 may be a pulse amplitude modulation unit (PAM unit) that performs pulse amplitude modulation. The second pixel driving unit PDU2 may be a constant current generator generating a constant driving current according to the first PWM data voltage.

In addition, the second pixel driving unit PDU2 of each of the first sub-pixels SP1 may receive the same first PWM data voltage and generate the same driving current regardless of the luminance of the first sub-pixel SP1. Similarly, the second pixel driving unit PDU2 of each of the second sub-pixels SP2 may receive the same second PWM data voltage and generate the same driving current regardless of the luminance of the second sub-pixel SP2. The third pixel driving unit PDU3 of each of the third sub-pixels SP3 may receive the same third PWM data voltage and generate the same driving current regardless of the luminance of the third sub-pixel SP3.

The second pixel driving unit PDU2 may include eighth to fourteenth transistors T8 to T14 and a second capacitor C2.

The eighth transistor T8 controls the driving current flowing to the light emitting element EL according to the voltage applied to the gate electrode.

The ninth transistor T9 is turned-on by a $k^{th}$ scan write signal of a $k^{th}$ scan write line GWLk to supply the first PWM data voltage of the first data line RDL to the first electrode of the eighth transistor T8. The gate electrode of the ninth transistor T9 may be connected to the $k^{th}$ scan write line GWLk, the first electrode may be connected to the first data line RDL, and the second electrode may be connected to the first electrode of the eighth transistor T8.

The tenth transistor T10 is turned-on by a $k^{th}$ scan initialization signal of a $k^{th}$ scan initialization line GILk to connect the third power supply line VSL to the gate electrode of the eighth transistor T8. Accordingly, the gate electrode of the eighth transistor T8 may be discharged to the voltage of the third power supply line VSL during the turned-on period of the tenth transistor T10. In this case, the gate-on voltage VGL of the $k^{th}$ scan initialization signal may be different from the voltage of the third power supply line VSL. Especially, because the difference voltage between the gate-on voltage VGL and the voltage of the third power supply line VSL is greater than the threshold voltage of the tenth transistor T10, the tenth transistor T10 may be stably turned-on even after the voltage of the third power supply line VSL is applied to the gate electrode of the eighth transistor T8. Accordingly, when the tenth transistor T10 is turned-on, the voltage of the third power supply line VSL may be stably applied to the gate electrode of the eighth transistor T8 regardless of the threshold voltage of the tenth transistor T10.

The tenth transistor T10 may include a plurality of transistors connected in series. For example, the tenth transistor T10 may include a fifth sub-transistor T101 and a sixth sub-transistor T102. Accordingly, it is possible to reduce the voltage of the gate electrode of the eighth transistor T8 from leaking through the tenth transistor T10.

The gate electrode of the fifth sub-transistor T101 may be connected to the $k^{th}$ scan initialization line GILk, the first electrode may be connected to the gate electrode of the eighth transistor T8, and the second electrode may be connected to the first electrode of the sixth sub transistor T102. The gate electrode of the sixth sub-transistor T102 may be connected to the $k^{th}$ scan initialization line GILk, the first electrode may be connected to the second electrode of the fifth sub-transistor T101, and the second electrode may be connected to the third power supply line VSL.

The eleventh transistor T11 is turned-on by the $k^{th}$ scan write signal of the $k^{th}$ scan write line GWLk and connects the gate electrode and the second electrode of the eighth transistor T8. Accordingly, the eighth transistor T8 may operate as a diode (the eighth transistor T8 is diode-connected) while the eleventh transistor T11 is turned-on.

The eleventh transistor T11 may include a plurality of transistors connected in series. For example, the eleventh transistor T11 may include a seventh sub-transistor T111 and an eighth sub-transistor T112. Accordingly, it is possible to reduce the voltage of the gate electrode of the eighth transistor T8 from leaking through the eleventh transistor T11.

The gate electrode of the seventh sub-transistor T111 may be connected to the $k^{th}$ scan write line GWLk, the first electrode may be connected to the second electrode of the eighth transistor T8, and the second electrode may be connected to the first electrode of the eighth sub transistor T112. The gate electrode of the eighth sub-transistor T112 may be connected to the $k^{th}$ scan write line GWLk, the first electrode may be connected to the second electrode of the seventh sub-transistor T111, and the second electrode may be connected to the gate electrode of the eighth transistor T8.

The twelfth transistor T12 is turned-on by the $k^{th}$ PWM light emitting signal of the $k^{th}$ PWM light emitting line PWELk to connect the first electrode of the eighth transistor T8 to the second power supply line VDL2.

The twelfth transistor T12 may include a plurality of transistors connected in parallel. For example, the twelfth transistor T12 may include a ninth sub-transistor T121 and a tenth sub-transistor T122. As a result, the path through which the current of the first electrode of the eighth transistor T8 flows from the second power supply line VDL2 increases. Therefore, the current from the second power supply line VDL2 to the first electrode of the eighth transistor T8 may flow more smoothly.

The gate electrode of the ninth sub-transistor T121 may be connected to the $k^{th}$ PWM light emitting line PWELk, the first electrode may be connected to the second power supply line VDL2, and the second electrode may be connected to the first electrode of the eighth transistor T8. The gate electrode of the tenth sub-transistor T122 may be connected to the $k^{th}$ PWM light emitting line PWELk, the first electrode may be connected to the second power supply line VDL2, and the second electrode may be connected to the first electrode of the eighth transistor T8.

The thirteenth transistor T13 is turned-on by the $k^{th}$ scan control signal of the $k^{th}$ scan control line GCLk and connects the first power supply line VDL1 to a second node N2. The gate electrode of the thirteenth transistor T13 may be connected to the $k^{th}$ scan control line GCLk, the first electrode may be connected to the first power supply line VDL1, and the second electrode may be connected to the second node N2.

The fourteenth transistor T14 is turned-on by the $k^{th}$ PWM light emitting signal of the $k^{th}$ PWM light emitting line PWELk and connects the second power supply line VDL2 to the second node N2. Accordingly, when the fourteenth transistor T14 is turned-on, the second power supply voltage VDD2 of the second power supply line VDL2 may be supplied to the second node N2. The gate electrode of the fourteenth transistor T14 may be connected to the $k^{th}$ PWM light emitting line PWELk, the first electrode may be connected to the second power supply line VDL2, and the second electrode may be connected to the second node N2.

The second capacitor C2 may be disposed between the gate electrode of the eighth transistor T8 and the second node N2. One electrode of the second capacitor C2 may be connected to the gate electrode of the eighth transistor T8, and the other electrode thereof may be connected to the second node N2.

The second node N2 may be the contact point of the second electrode of the thirteenth transistor T13, the second electrode of the fourteenth transistor T14, and the other electrode of the second capacitor C2.

The third pixel driving unit PDU3 adjusts the period in which the driving current is applied to the light emitting element EL according to the voltage of the third node N3.

The third pixel driving unit PDU3 may include fifteenth to nineteenth transistors T15 to T19 and a third capacitor C3.

The fifteenth transistor T15 is turned-on or turned-off depending on the voltage of the third node N3. When the fifteenth transistor T15 is turned-on, the driving current of the eighth transistor T8 may be supplied to the light emitting element EL. Also, when the fifteenth transistor T15 is turned-off, the driving current of the eighth transistor T8 may not be supplied to the light emitting element EL. Therefore, the turned-on period of the fifteenth transistor T15 may be substantially the same as the emission period of the light emitting element EL. The gate electrode of the fifteenth transistor T15 may be connected to the third node N3, the first electrode may be connected to the second electrode of the eighth transistor T8, and the second electrode may be connected to the first electrode of the seventeenth transistor T17.

The sixteenth transistor T16 is turned-on by the $k^{th}$ scan control signal of the $k^{th}$ scan control line GCLk to connect the initialization voltage line VIL to the third node N3. Accordingly, the third node N3 may be discharged to the initialization voltage of the initialization voltage line VIL during the turned-on period of the sixteenth transistor T16.

The sixteenth transistor T16 may include a plurality of transistors connected in series. For example, the sixteenth transistor T16 may include an eleventh sub-transistor T161 and a twelfth sub-transistor T162. Accordingly, it is possible to prevent the voltage of the third node N3 from leaking through the sixteenth transistor T16. The gate electrode of the eleventh sub-transistor T161 may be connected to the $k^{th}$ scan control line GCLk, the first electrode may be connected to the third node N3, and the second electrode may be connected to the first electrode of the twelfth sub-transistor T162. The gate electrode of the twelfth sub-transistor T162 may be connected to the $k^{th}$ scan control line GCLk, the first electrode may be connected to the second electrode of the eleventh sub-transistor T161, and the second electrode may be connected to the initialization voltage line VIL.

The seventeenth transistor T17 is turned-on by a $k^{th}$ PAM light emitting signal of the $k^{th}$ PAM light emitting line PAELk to connect the second electrode of the fifteenth transistor T15 to the first electrode of the light emitting element EL. The gate electrode of the seventeenth transistor T17 may be connected to the $k^{th}$ PAM light emitting line PAELk, the first electrode may be connected to the second electrode of the fifteenth transistor T15, and the second electrode may be connected to the first electrode of the light emitting element EL.

The eighteenth transistor T18 is turned-on by the $k^{th}$ scan control signal of the $k^{th}$ scan control line GCLk to connect the third power supply line VSL to the first electrode of the light emitting element EL. Accordingly, the first electrode of the light emitting element EL may be discharged to the third power supply voltage of the third power supply line VSL during the turned-on period of the eighteenth transistor T18.

The nineteenth transistor T19 is turned-on by a test signal of a test signal line TSTL to connect the first electrode of the light emitting element EL to the $j^{th}$ data line DLj. Accordingly, the voltage or current of the first electrode of the light emitting element EL may be sensed using the $j^{th}$ data line DLj by turning on the nineteenth transistor T19 in the test mode.

The nineteenth transistor T19 may include a plurality of transistors connected in series. For example, the nineteenth transistor T19 may include a thirteenth sub-transistor T191 and a fourteenth sub-transistor T192. The gate electrode of the thirteenth sub-transistor T191 may be connected to the test signal line TSTL, the first electrode may be connected to the first electrode of the light emitting element EL, and the second electrode may be connected to the first electrode of the fourteenth sub-transistor T192. The gate electrode of the fourteenth sub-transistor T192 may be connected to the test signal line TSTL, the first electrode may be connected to the second electrode of the fourteenth sub-transistor T191, and the second electrode may be connected to the $j^{th}$ data line DLj.

The third capacitor C3 may be disposed between the third node N3 and the initialization voltage line VIL. One electrode of the third capacitor C3 may be connected to the third node N3, and the other electrode thereof may be connected to the initialization voltage line VIL.

The third node N3 may be the contact point of the second electrode of the sixth transistor T6, the gate electrode of the fifteenth transistor T15, the first electrode of the ninth sub-transistor T161, and one electrode of the third capacitor C3.

One of the first electrode and the second electrode of each of the first to nineteenth transistors T1 to T19 may be a source electrode, and the other may be a drain electrode. The active layer of each of the first to nineteenth transistors T1 to T19 may be formed of one of poly silicon, amorphous silicon, and an oxide semiconductor. When the active layer of each of the first to nineteenth transistors T1 to T19 is polysilicon, it may be formed through a low temperature polysilicon (LTPS) process.

In addition, in FIG. 5, it has been mainly described that each of the first to nineteenth transistors T1 to T19 is formed of a P-type MOSFET, but the present disclosure is not limited thereto. For example, each or at least some of the first to nineteenth transistors T1 to T19 may be formed of an N-type MOSFET.

The second sub-pixel SP2 and the third sub-pixel SP3 according to one or more embodiments may be substantially the same as the first sub-pixel SP1 described in connection with FIG. 5. Therefore, descriptions of the second sub-pixel SP2 and the third sub-pixel SP3 according to one or more embodiments are omitted.

Figure 6:
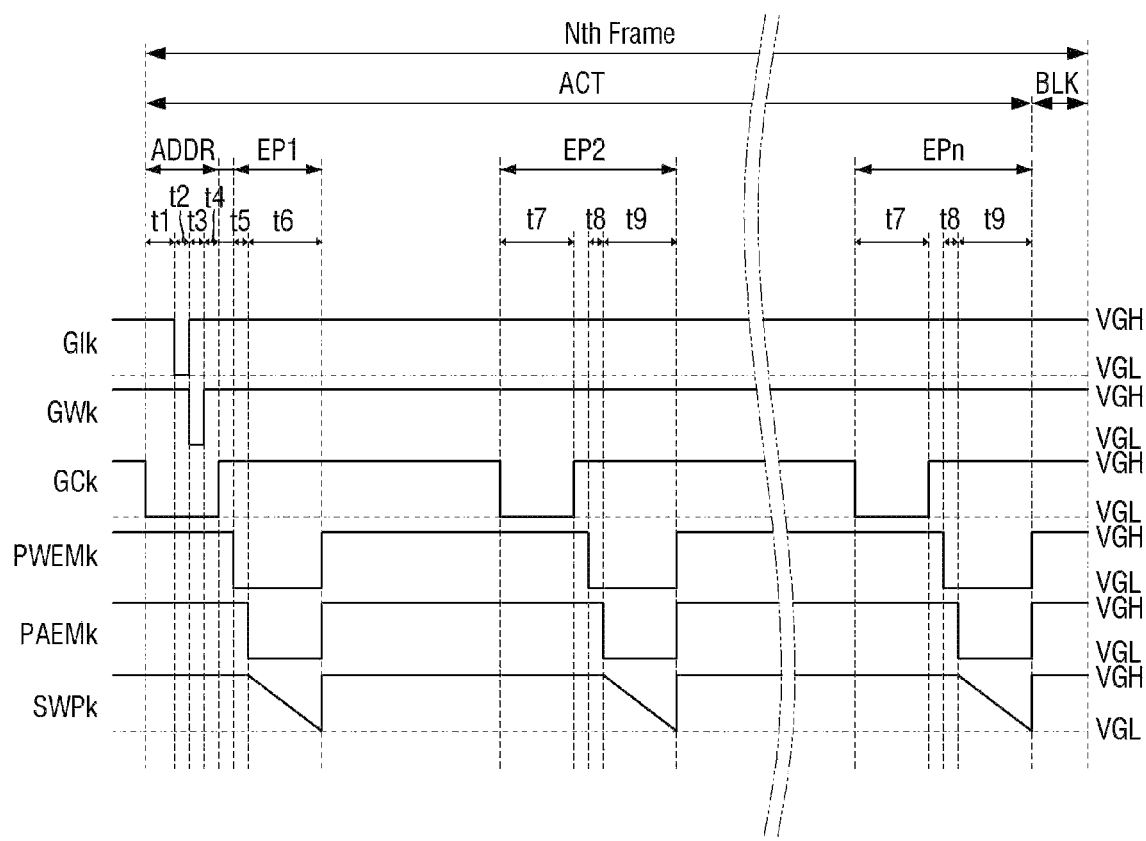
FIG. 6 is a waveform view illustrating a scan initialization signal, a scan write signal, a scan control signal, a PWM emitting signal, a PAM emitting signal, and a sweep signal applied to each of the sub-pixels disposed on the $k^{th}$ row line during one frame period.

FIG. 6 is a waveform view illustrating a scan initialization signal, a scan write signal, a scan control signal, a PWM emitting signal, a PAM emitting signal, and a sweep signal applied to each of the sub-pixels disposed on the $k^{th}$ row line during one frame period.

Referring to FIG. 6, the $k^{th}$ scan initialization signal GIk is a signal for controlling the turn-on and turn-off of the third and tenth transistors T3 and T10 of each of the sub-pixels SP1, SP2, and SP3. The $k^{th}$ scan write signal GWk is a signal for controlling the turn-on and turn-off of the second, fourth, ninth, and eleventh transistors T2, T4, T9, and T11 of each of the sub-pixels SP1, SP2, and SP3. The $k^{th}$ scan control signal GGk is a signal for controlling the turn-on and turn-off of the seventh, thirteenth, sixteenth, and eighteenth transistors T7, T13, T16, and T18 of each of the sub-pixels SP1, SP2, and SP3. The $k^{th}$ PWM light emitting signal PWEMk is a signal for controlling the turn-on and turn-off of the fifth, sixth, twelfth, and fourteenth transistors T5, T6, T12, and T14. The $k^{th}$ PAM light emitting signal PAEMk is a signal for controlling the turn-on and turn-off of the seventeenth transistor T17. The $k^{th}$ scan initialization signal, the $k^{th}$ scan write signal, the $k^{th}$ scan control signal, the $k^{th}$ PWM light emitting signal, the $k^{th}$ PAM light emitting signal, and the $k^{th}$ sweep signal may occur at intervals of one frame period.

A data address period ADDR may include a first to fourth period t1 to t4. The first period t1 and the fourth period t4 are first initialization periods to initialize the voltage of the first electrode of the light emitting element EL and the third node N3. The second period t2 is a second initialization period to initialize the gate electrode of the first transistor T1 and the gate electrode of the eighth transistor T8. The third period t3 is a period for sampling the data voltage of the $j^{th}$ data line DLj and the threshold voltage of the first transistor T1 at the gate electrode of the first transistor T1, and the first PAM data voltage of the first PAM data line RDL and the threshold voltage of the eighth transistor T8 at the gate electrode of the eighth transistor T8.

A first light emitting period EP1 includes a fifth period t5 and a sixth period t6. The fifth period t5 is a period for applying a control current to the third node N3, and the sixth period t6 is a period for controlling the turn-on period of the fifteenth transistor T15 according to the control current and supplying the driving current to the light emitting element EL.

Each of the second to $n^{th}$ light emitting periods EP2 to EPn includes a seventh to ninth period t7 to t9. The seventh period t7 is a third initialization period for initializing the third node N3, the eighth period t8 is a period substantially equal to the fifth period t5, and the ninth period t9 is a period substantially equal to the sixth period t6.

Among the first to $n^{th}$ light emitting periods EP1 to EPn, neighboring light emitting periods may be spaced by approximately several to tens of horizontal periods.

The $k^{th}$ scan initialization signal GIk may have the gate-on voltage VGL during the second period t2 and the gate-off voltage VGH during the remaining periods. The $k^{th}$ scan write signal GWk has the gate-on voltage VGL during the third period t3 and may have the gate-off voltage VGH during the remaining periods. The $k^{th}$ scan control signal GGk has the gate-on voltage VGL during the first to fourth periods t1 to t4 and the seventh period t7 and may have the gate-off voltage VGH during the remaining periods. The gate-off voltage VGH may be a higher-level voltage than the gate-on voltage VGL.

The $k^{th}$ PWM light emitting signal PWEMk may have the gate-on voltage VGL during the fifth and sixth periods t5 and t6 and the eighth and ninth periods t8 and t9, and the gate-off voltage VGH during the remaining periods. The $k^{th}$ PAM light emitting signal PAEMk may have the gate-on voltage VGL during the sixth period t6 and the ninth period t9, and the gate-off voltage VGH during the remaining periods.

The $k^{th}$ sweep signal SWPk may have a triangular wave-shaped pulse during the sixth period t6 and the ninth period t9, and the gate-off voltage VGH during the remaining periods. For example, the $k^{th}$ sweep signal SWPk may have the triangular wave-shaped pulse during the sixth period t6. For example, the $k^{th}$ sweep signal SWPk may linearly decrease from the gate-off voltage VGH to the gate-on voltage VGL during the sixth period t6 and may increase from the gate-on voltage VGL to the gate-off voltage VGH at the end of the sixth period t6.

The $k^{th}$ PWM light emitting signal PWEMk may have the gate-on voltage VGL during the fifth and sixth periods t5 and t6 and the eighth and ninth periods t8 and t9, and the gate-off voltage VGH during the remaining periods. The $k^{th}$ PAM light emitting signal PAEMk may have the gate-on voltage VGL during the sixth period t6 and the ninth period t9, and the gate-off voltage VGH during the remaining periods. The pulse width of the $k^{th}$ PWM light emitting signal PWEMk may be larger than the pulse width of the $k^{th}$ sweep signal SWPk.

Referring back to FIGS. 5 and 6, a first parasitic capacitor PC1 may be formed between the $k^{th}$ sweep signal line SWPLk and the first electrode of the first transistor T1, and a second parasitic capacitor PC2 may be formed between the $k^{th}$ sweep signal line SWPLk and the second electrode of the first transistor T1. As shown in FIG. 6, because pulses of the $k^{th}$ sweep signal SWPk applied to the $k^{th}$ sweep signal line SWPLk occur every plurality of light emitting periods EP1, EP2, ..., EPn in the one-frame period, the voltage variation of the $k^{th}$ sweep signal line SWPLk by the first parasitic capacitor PC1 for each of the plurality of light emitting periods EP1, EP2, ..., EPn of one frame period is reflected in the first electrode of the first transistor T1 and the voltage variation of the $k^{th}$ sweep signal line SWPLk may be reflected on the second electrode of the first transistor T1 by the second parasitic capacitor PC2.

That is, the voltage of the first electrode of the first transistor T1 may be unwantedly varied by the first parasitic capacitor PC1, and the voltage of the second electrode of the first transistor T1 may be unwantedly varied by the second parasitic capacitor PC2. In this case, the control current of the first transistor T1 may fluctuate by fluctuating the voltage between the first electrode and the gate electrode of the first transistor T1. Therefore, it is desirable to reduce or minimize the first parasitic capacitor PC1 and the second parasitic capacitor PC2. Hereinafter, the layout of the first sub-pixel SP1 capable of reducing or minimizing the first parasitic capacitor PC1 and the second parasitic capacitor PC2 will be described in detail with reference to FIGS. 7 to 12.

Figure 7:
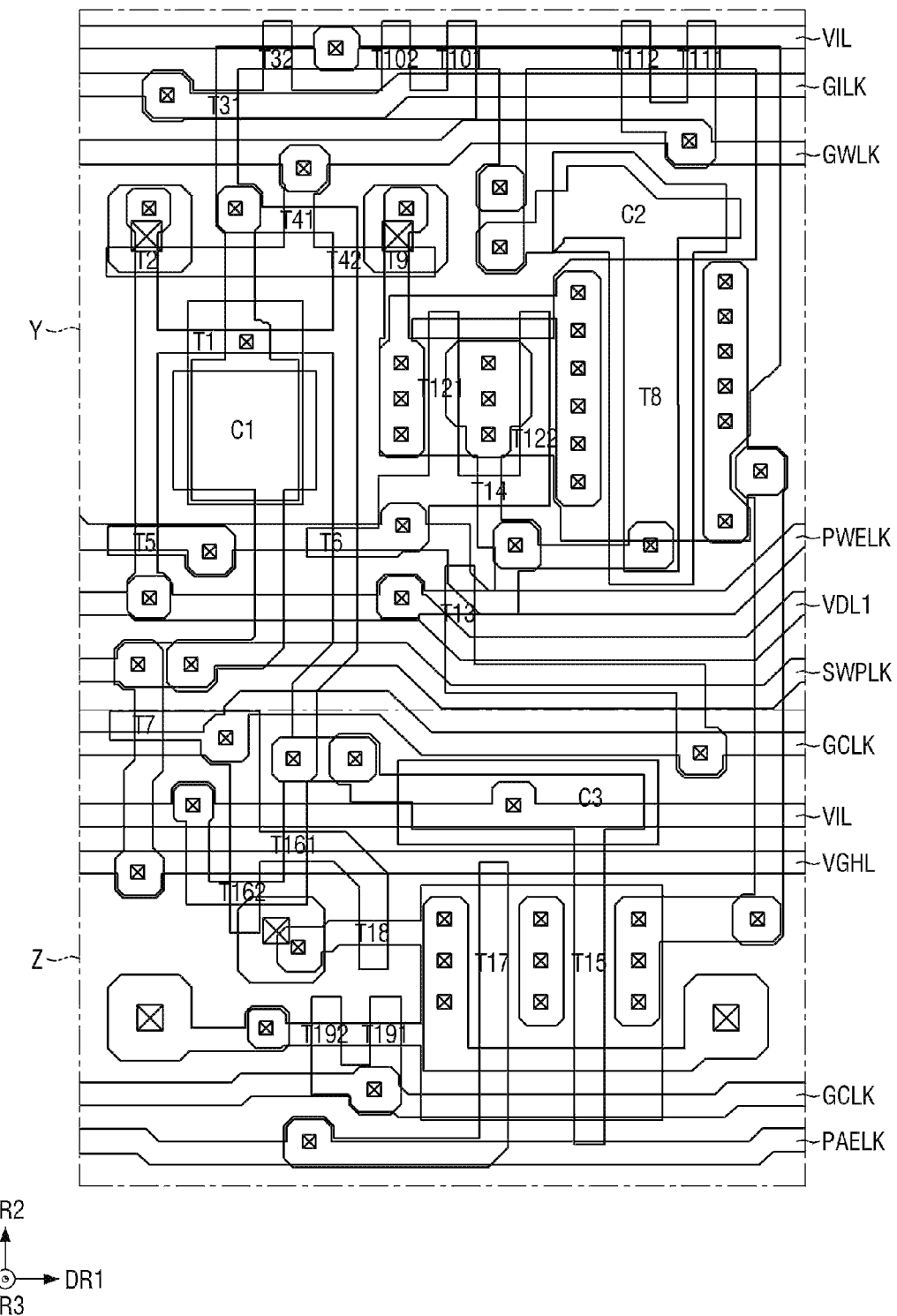
FIGS. 7 and 8 are layout views illustrating a portion of a first sub-pixel, according to one or more embodiments.
Figure 8:
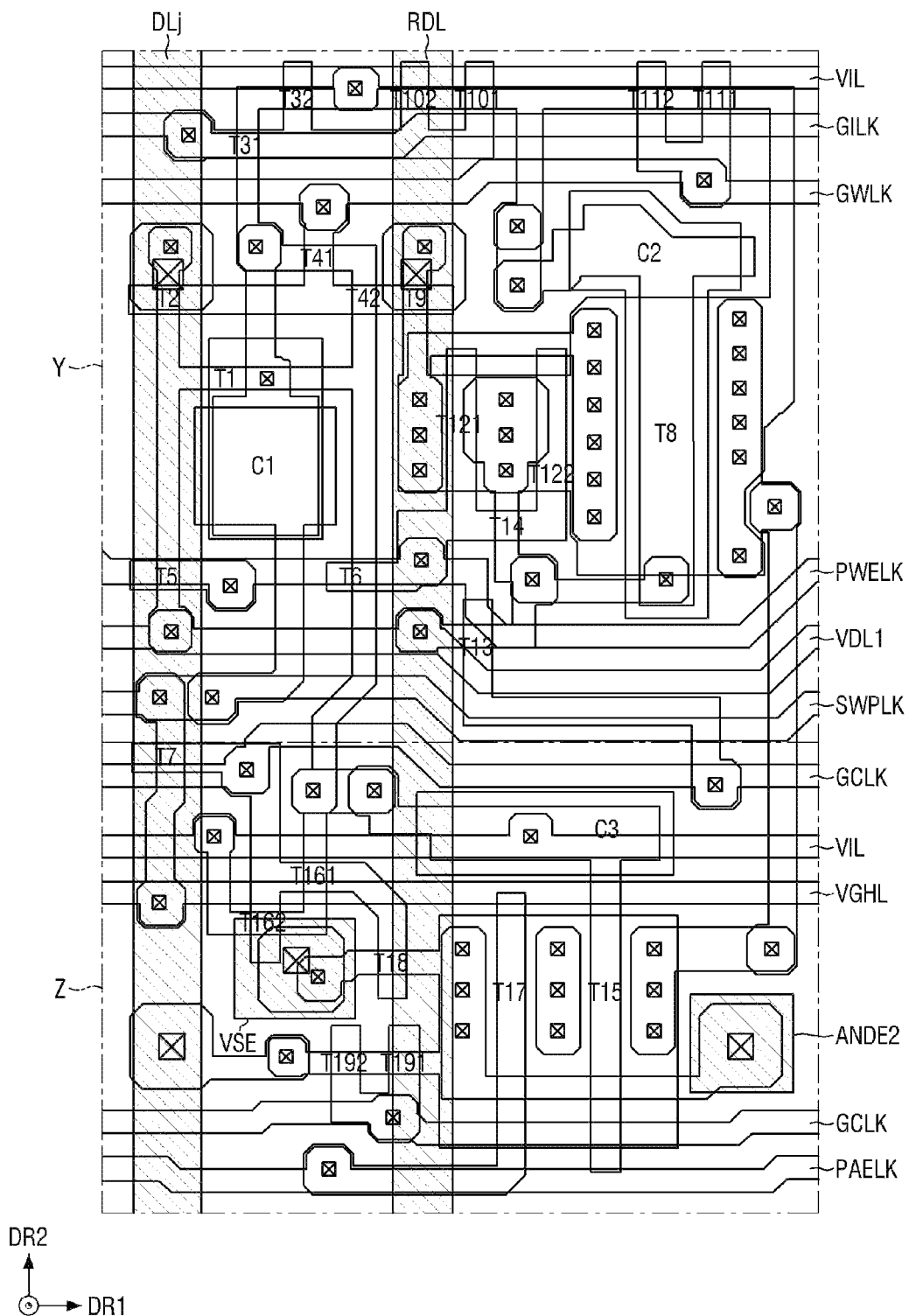
Figure 9:
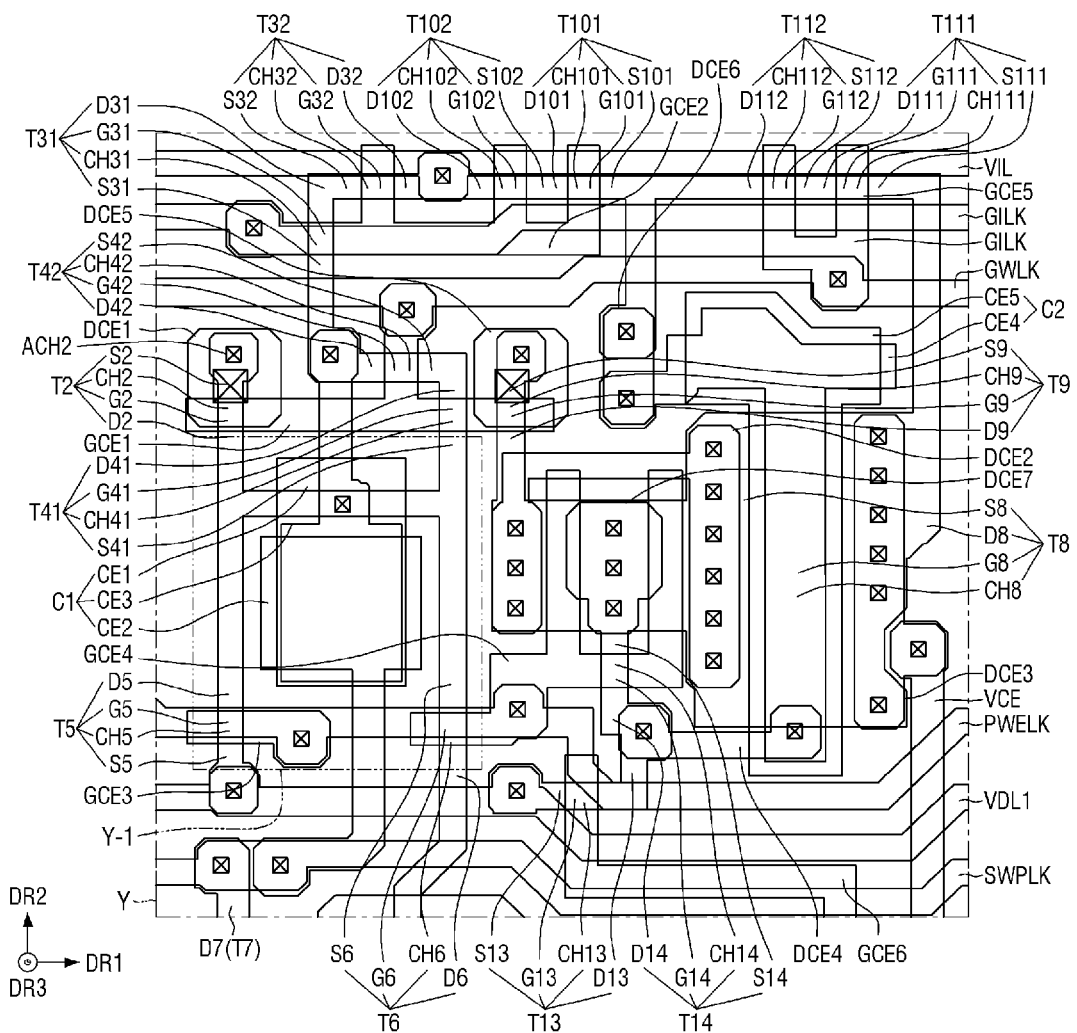
FIGS. 9 and 10 are enlarged layout views illustrating one example of an area Y of FIG. 7.
Figure 10:
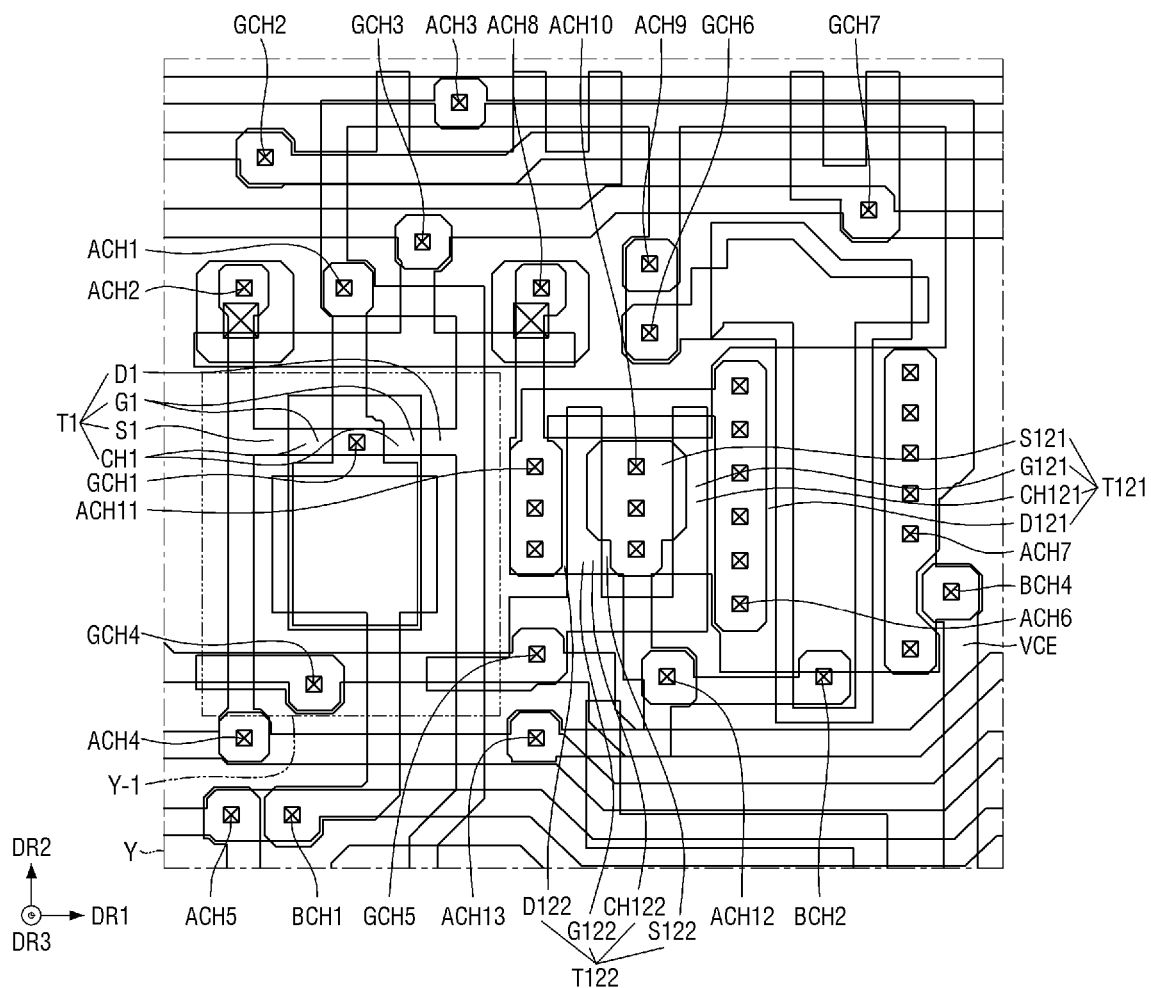
Figure 11:
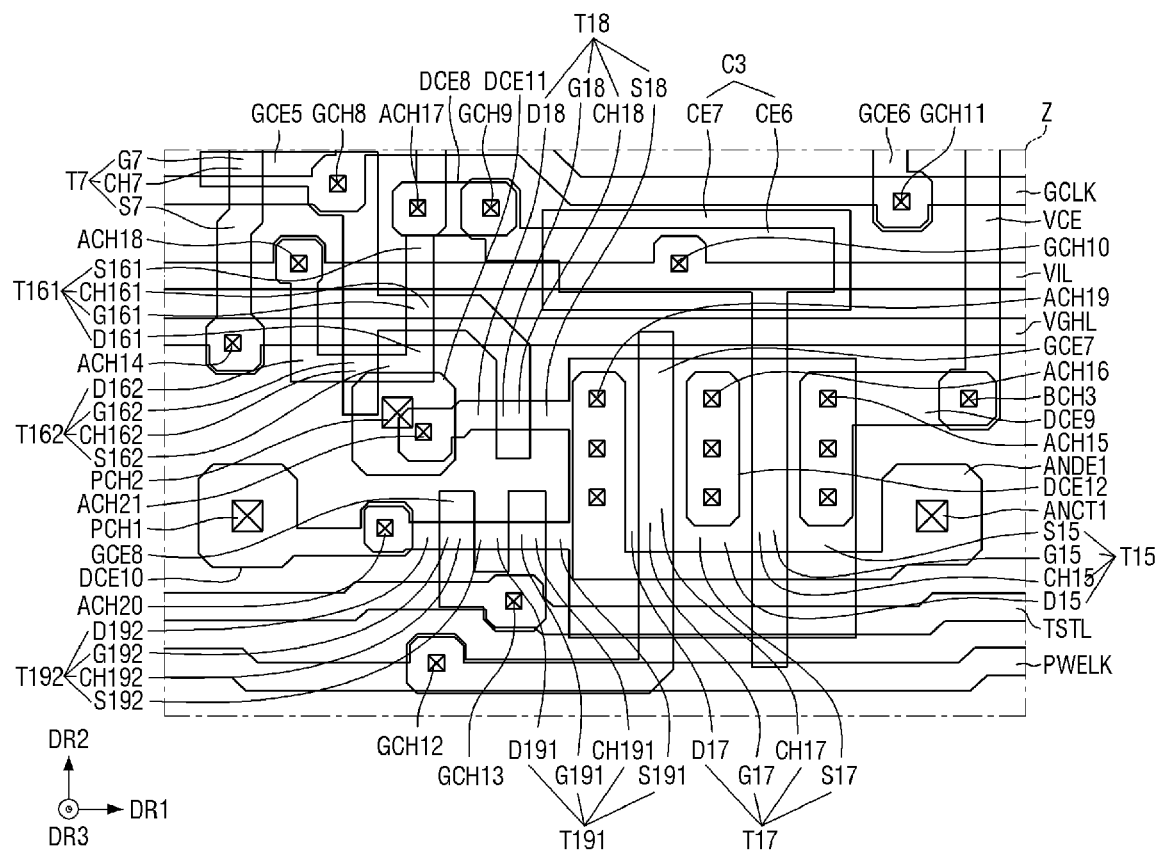
FIG. 11 is an enlarged layout view illustrating one example of an area Z of FIG. 7.

FIGS. 7 and 8 are layout views illustrating a portion of a first sub-pixel, according to one or more embodiments. FIGS. 9 and 10 are enlarged layout views illustrating one example of an area Y of FIG. 7. FIG. 11 is an enlarged layout view illustrating one example of an area Z of FIG. 7.

The active layer ACT, the first gate metal layer GTL1, the second gate metal layer GTL2, and the first source metal layer of the first sub-pixel SP1 according to one or more embodiments are described with reference to FIGS. 7 to 11.

Referring to FIGS. 7 to 11, the initialization voltage lines VIL, the $k^{th}$ scan initialization line GILk, the $k^{th}$ scan write line GWLk, the $k^{th}$ PWM light emitting line PWELk, the first power supply line VDL1, the $k^{th}$ sweep signal line SWPLk, the $k^{th}$ scan control line GCLk, the gate-off voltage line VGHL, the test signal line TSTL, and the $k^{th}$ PAM light emitting line PAELk may be extended in the first direction DR1. The initialization voltage line VIL, the $k^{th}$ scan initialization line GILk, the $k^{th}$ scan write line GWLk, the $k^{th}$ PWM light emitting line PWELk, the first power supply line VDL1, the $k^{th}$ sweep signal line SWPLk, the $k^{th}$ scan control line GCLk, the gate-off voltage line VGHL, the test signal line TSTL, and the $k^{th}$ PAM light emitting line PAELk are spaced from each other, and may be arranged along the second direction DR2.

The $j^{th}$ data line DLj and the first PAM data line RDL may be extended in the second direction DR2. The $j^{th}$ data line DLj and the first PAM data line RDL may be spaced from each other and may be arranged along the first direction DR1.

Referring to FIGS. 7 to 11, the first sub-pixel SP1 includes first to nineteenth transistors T1 to T19, first to seventh capacitor electrodes CE1 to CE7, first to ninth gate connection electrodes GCE1 to GCE9, first to twelfth data connection electrodes DCE1 to DCE12, a vertical connection electrode VCE, and a first anode connection electrode ANDE1.

In FIGS. 7 to 11, the first electrode of each of the first to nineteenth transistors T1 to T19 is illustrated as a source electrode, and the second electrode is illustrated as a drain electrode for convenience of description.

The first transistor T1 includes a first channel CH1, a first gate electrode G1, a first source electrode S1, and a first drain electrode D1. The first channel CH1 may be extended in the first direction DR1. The first channel CH1 may overlap the first gate electrode G1 in a third direction DR3 (e.g., a thickness direction of the substrate SUB). The first gate electrode G1 may be connected to a third capacitor electrode CE3 through a first gate contact hole GCH1. The first gate electrode G1 may be connected to a first capacitor electrode CE1. The first gate electrode G1 and the first capacitor electrode CE1 may be integrally formed. The first source electrode S1 may be disposed on one side of the first channel CH1, and the first drain electrode D1 may be disposed on the other side of the first channel CH1. The first source electrode S1 may be connected to a second drain electrode D2 and a fifth drain electrode D5. The first drain electrode D1 may be connected to a third sub-source electrode S41 and a sixth source electrode S6. The first source electrode S1 and the first drain electrode D1 may not overlap the first gate electrode G1 in the third direction DR3. The first source electrode S1 and the first drain electrode D1 do not overlap a second capacitor electrode CE2 in the third direction DR3.

The second transistor T2 includes a second channel CH2, a second gate electrode G2, a second source electrode S2, and a second drain electrode D2. The second channel CH2 may overlap the second gate electrode G2 in the third direction DR3. The second gate electrode G2 may be integrally formed with a first gate connection electrode GCE1. The second source electrode S2 may be disposed on one side of the second channel CH2, and the second drain electrode D2 may be disposed on the other side of the second channel CH2. The second source electrode S2 may be connected to a first data connection electrode DCE1 through a second active contact hole ACH2. The second drain electrode D2 may be connected to the first source electrode S1. The second source electrode S2 and the second drain electrode D2 may not overlap the second gate electrode G2 in the third direction DR3.

The first sub-transistor T31 of the third transistor T3 includes a first sub-channel CH31, a first sub-gate electrode G31, a first sub-source electrode S31, and a first sub-drain electrode D31. The first sub-channel CH31 may overlap the first sub-gate electrode G31 in the third direction DR3. The first sub-gate electrode G31 may be integrally formed with a second gate connection electrode GCE2. The first sub-source electrode S31 may be disposed on one side of the first sub-channel CH31, and the first sub-drain electrode D31 may be disposed on the other side of the first sub-channel CH31. The first sub-source electrode S31 may be connected to the third capacitor electrode CE3 through a first active contact hole ACH1, and the first sub-drain electrode D31 may be connected to a second sub-source electrode S32. The first sub-source electrode S31 and the first sub-drain electrode D31 may not overlap the first sub-gate electrode G31.

The second sub-transistor T32 of the third transistor T3 includes a second sub-channel CH32, a second sub-gate electrode G32, a second sub-source electrode S32, and a second sub-drain electrode D32. The second sub-channel CH32 may overlap the second sub-gate electrode G32 in the third direction DR3. The second sub-gate electrode G32 may be integrally formed with the second gate connection electrode GCE2. The second sub-source electrode S32 may be disposed on one side of the second sub-channel CH32, and the second sub-drain electrode D32 may be disposed on the other side of the second sub-channel CH32. The second sub-source electrode S32 may be connected to the first sub-drain electrode D31, and the second sub-drain electrode D32 may be connected to the initialization voltage line VIL through a third active contact hole ACH3. The second sub-source electrode S32 and the second sub-drain electrode D32 may not overlap the second sub-gate electrode G32.

The third sub-transistor T41 of the fourth transistor T4 includes a third sub-channel CH41, a third sub-gate electrode G41, a third sub-source electrode S41, and a third sub-drain electrode D41. The third sub-channel CH41 may overlap the third sub-gate electrode G41 in the third direction DR3. The third sub-gate electrode G41 may be integrally formed with the first gate connection electrode GCE1. The third sub-source electrode S41 may be disposed on one side of the third sub-channel CH41, and the third sub-drain electrode D41 may be disposed on the other side of the third sub-channel CH41. The third sub-source electrode S41 may be connected to the first drain electrode D1, and the third sub-drain electrode D41 may be connected to a fourth sub-source electrode S42. The third sub-source electrode S41 and the third sub-drain electrode D41 may not overlap the third sub-gate electrode G41.

The fourth sub-transistor T42 of the fourth transistor T4 includes a fourth sub-channel CH42, a fourth sub-gate electrode G42, a fourth sub-source electrode S42, and a fourth sub-drain electrode D42. The fourth sub-channel CH42 may overlap the fourth sub-gate electrode G42 in the third direction DR3. The fourth sub-gate electrode G42 may be integrally formed with the first gate connection electrode GCE1. The fourth sub-source electrode S42 may be disposed on one side of the fourth sub-channel CH42, and the fourth sub-drain electrode D42 may be disposed on the other side of the fourth sub-channel CH42. The fourth sub-source electrode S42 may be connected to the third sub-drain electrode D41, and the fourth sub-drain electrode D42 may be connected to the third capacitor electrode CE3 through the first active contact hole ACH1. The fourth sub-source electrode S42 and the fourth sub-drain electrode D42 may not overlap the fourth sub-gate electrode G42.

The fifth transistor T5 includes a fifth channel CH5, a fifth gate electrode G5, a fifth source electrode S5, and a fifth drain electrode D5. The fifth channel CH5 may overlap the fifth gate electrode G5 in the third direction DR3. The fifth gate electrode G5 may be integrally formed with a third gate connection electrode GCE3. The fifth source electrode S5 may be disposed on one side of the fifth channel CH5, and the fifth drain electrode D5 may be disposed on the other side of the fifth channel CH5. The fifth source electrode S5 may be connected to the first power supply line VDL1 through a fourth active contact hole ACH4. The fifth drain electrode D5 may be connected to the first source electrode S1. The fifth source electrode S5 and the fifth drain electrode D5 may not overlap the fifth gate electrode G5 in the third direction DR3.

The sixth transistor T6 includes a sixth channel CH6, a sixth gate electrode G6, a sixth source electrode S6, and a sixth drain electrode D6. The sixth channel CH6 may overlap the sixth gate electrode G6 in the third direction DR3. The sixth gate electrode G6 may be integrally formed with a fourth gate connection electrode GCE4. The sixth source electrode S6 may be disposed on one side of the sixth channel CH6, and the sixth drain electrode D6 may be disposed on the other side of the sixth channel CH6. The sixth source electrode S6 may be connected to the first drain electrode D1. The sixth drain electrode D6 may be connected to an eighth data connection electrode DCE8 through a seventeenth contact hole CT17. The sixth source electrode S6 and the sixth drain electrode D6 may not overlap the sixth gate electrode G6 in the third direction DR3.

The seventh transistor T7 includes a seventh channel CH7, a seventh gate electrode G7, a seventh source electrode S7, and a seventh drain electrode D7. The seventh channel CH7 may overlap the seventh gate electrode G7 in the third direction DR3. The seventh gate electrode G7 may be integrally formed with a fifth gate connection electrode GCE5. The seventh source electrode S7 may be disposed on one side of the seventh channel CH7, and the seventh drain electrode D7 may be disposed on the other side of the seventh channel CH7. The seventh source electrode S7 may be connected to the gate-off voltage line VGHL through a fourteenth active contact hole ACH14. The seventh drain electrode D7 may be connected to the $k^{th}$ sweep signal line SWPLk through a fifth active contact hole ACH5. The seventh source electrode S7 and the seventh drain electrode D7 may not overlap the seventh gate electrode G7 in the third direction DR3.

The eighth transistor T8 includes an eighth channel CH8, an eighth gate electrode G8, an eighth source electrode S8, and an eighth drain electrode D8. The eighth channel CH8 may overlap the eighth gate electrode G8 in the third direction DR3. The eighth gate electrode G8 may be connected to a fourth data connection electrode DCE4 through a second connection contact hole BCH2. The eighth gate electrode G8 may be integrally formed with a fourth capacitor electrode CE4. The eighth source electrode S8 may be disposed on one side of the eighth channel CH8, and the eighth drain electrode D8 may be disposed on the other side of the eighth channel CH8. The eighth source electrode S8 may be connected to a second data connection electrode DCE2 through a sixth active contact hole ACH6. The eighth drain electrode D8 may be connected to a seventh sub-source electrode S111 and connected to the vertical connection electrode VCE through a seventh active contact holes ACH7. The eighth source electrode S8 and the eighth drain electrode D8 may not overlap the eighth gate electrode G8 in the third direction DR3.

The ninth transistor T9 includes a ninth channel CH9, a ninth gate electrode G9, a ninth source electrode S9, and a ninth drain electrode D9. The ninth channel CH9 may overlap the ninth gate electrode G9 in the third direction DR3. The ninth gate electrode G9 may be integrally formed with the first gate connection electrode GCE1. The ninth source electrode S9 may be disposed on one side of the ninth channel CH9, and the ninth drain electrode D9 may be disposed on the other side of the ninth channel CH9. The ninth source electrode S9 may be connected to a fifth data connection electrode DCE5 through an eighth active contact hole ACH8. The ninth drain electrode D9 may be connected to a tenth sub-drain electrode D122 of the tenth sub-transistor T122. The ninth source electrode S9 and the ninth drain electrode D9 may not overlap the ninth gate electrode G9 in the third direction DR3.

The fifth sub-transistor T101 of the tenth transistor T10 includes a fifth sub-channel CH101, a fifth sub-gate electrode G101, a fifth sub-source electrode S101, and a fifth sub-drain electrode D101. The fifth sub-channel CH101 may overlap the fifth sub-gate electrode G101 in the third direction DR3. The fifth sub-gate electrode G101 may be integrally formed with the second gate connection electrode GCE2. The fifth sub-source electrode S101 may be disposed on one side of the fifth sub-channel CH101, and the fifth sub-drain electrode D101 may be disposed on the other side of the fifth sub-channel CH101. The fifth sub-source electrode S101 may be connected to a sixth data connection electrode DCE6 through a ninth active contact hole ACH9, and the fifth sub-drain electrode D101 may be connected to a sixth sub-source electrode S102. The fifth sub-source electrode S101 and the fifth sub-drain electrode D101 may not overlap the fifth sub-gate electrode G101.

The sixth sub-transistor T102 of the tenth transistor T10 includes a sixth sub-channel CH102, a sixth sub-gate electrode G102, a sixth sub-source electrode S102, and a sixth sub-drain electrode D102. The sixth sub-channel CH102 may overlap the sixth sub-gate electrode G102 in the third direction DR3. The sixth sub-gate electrode G102 may be integrally formed with the second gate connection electrode GCE2. The sixth sub-source electrode S102 may be disposed on one side of the sixth sub-channel CH102, and the sixth sub-drain electrode D102 may be disposed on the other side of the sixth sub-channel CH102. The sixth sub-source electrode S102 may be connected to the fifth sub-drain electrode D101, and the sixth sub-drain electrode D102 may be connected to the initialization voltage line VIL through the third active contact hole ACH3. The sixth sub-source electrode S102 and the sixth sub-drain electrode D102 may not overlap the sixth sub-gate electrode G102.

The seventh sub-transistor T111 of the eleventh transistor T11 includes a seventh sub-channel CH111, a seventh sub-gate electrode G111, a seventh sub-source electrode S111, and a seventh sub-drain electrode D111. The seventh sub-channel CH111 may overlap the seventh sub-gate electrode G111 in the third direction DR3. The seventh sub-gate electrode G111 may be integrally formed with the fifth gate connection electrode GCE5. The seventh sub-source electrode S111 may be disposed on one side of the seventh sub-channel CH111, and the seventh sub-drain electrode D111 may be disposed on the other side of the seventh sub-channel CH111. The seventh sub-source electrode S111 may be connected to the eighth drain electrode D8, and the seventh sub-drain electrode D111 may be connected to an eighth sub-source electrode S112. The seventh sub-source electrode S111 and the seventh sub-drain electrode D111 may not overlap the seventh sub-gate electrode G111.

The eighth sub-transistor T112 of the eleventh transistor T11 includes an eighth sub-channel CH112, an eighth sub-gate electrode G112, an eighth sub-source electrode S112, and an eighth sub-drain electrode D112. The eighth sub-channel CH112 may overlap the eighth sub-gate electrode G112 in the third direction DR3. The eighth sub-gate electrode G112 may be integrally formed with the fifth gate connection electrode GCE5. The eighth sub-source electrode S112 may be disposed on one side of the eighth sub-channel CH112, and the eighth sub-drain electrode D112 may be disposed on the other side of the eighth sub-channel CH112. The eighth sub-source electrode S112 may be connected to the seventh sub-drain electrode D111, and the eighth sub-drain electrode D112 may be connected to the sixth data connection electrode DCE6 through a ninth active contact hole ACH9. The eighth sub-source electrode S112 and the eighth sub-drain electrode D112 may not overlap the eighth sub-gate electrode G112.

The ninth sub-transistor T121 of the twelfth transistor T12 includes a ninth sub-channel CH121, a ninth sub-gate electrode G121, a ninth sub-source electrode S121, and a ninth sub-drain electrode D121. The ninth sub-channel CH121 may overlap the ninth sub-gate electrode G121 in the third direction DR3. The ninth sub-gate electrode G121 may be integrally formed with the fourth gate connection electrode GCE4. The ninth sub-source electrode S121 may be disposed on one side of the ninth sub-channel CH121, and the ninth sub-drain electrode D121 may be disposed on the other side of the ninth sub-channel CH121. The ninth sub-source electrode S121 may be connected to a seventh data connection electrode DCE7 through a tenth active contact holes ACH10. The ninth sub-drain electrode D121 may be connected to the second data connection electrode DCE2 through a sixth active contact holes ACH6. The ninth sub-source electrode S121 and the ninth sub-drain electrode D121 may not overlap the ninth sub-gate electrode G121 in the third direction DR3.

The tenth sub-transistor T122 of the twelfth transistor T12 includes a tenth sub-channel CH122, a tenth sub-gate electrode G122, a tenth sub-source electrode S122, and a tenth sub-drain electrode D122. The tenth sub-channel CH122 may overlap the tenth sub-gate electrode G122 in the third direction DR3. The tenth sub-gate electrode G122 may be integrally formed with the fourth gate connection electrode GCE4. The tenth sub-source electrode S122 may be disposed on one side of the tenth sub-channel CH122, and the tenth sub-drain electrode D122 may be disposed on the other side of the tenth sub-channel CH122. The tenth sub-source electrode S122 may be connected to the seventh data connection electrode DCE7 through the tenth active contact holes ACH10. The tenth sub-drain electrode D122 may be connected to the second data connection electrode DCE2 through an eleventh data connection contact holes DCH11. The tenth sub-source electrode S122 and the tenth sub-drain electrode D122 may not overlap the tenth sub-gate electrode G122 in the third direction DR3.

The thirteenth transistor T13 includes a thirteenth channel CH13, a thirteenth gate electrode G13, a thirteenth source electrode S13, and a thirteenth drain electrode D13. The thirteenth channel CH13 may overlap the thirteenth gate electrode G13 in the third direction DR3. The thirteenth gate electrode G13 may be integrally formed with a sixth gate connection electrode GCE6. The thirteenth source electrode S13 may be disposed on one side of the thirteenth channel CH13, and the thirteenth drain electrode D13 may be disposed on the other side of the thirteenth channel CH13. The thirteenth source electrode S13 may be connected to the first power supply line VDL1 through a thirteenth active contact hole ACH13. The thirteenth drain electrode D13 may be connected to the fourth data connection electrode DCE4 through a twelfth active contact hole ACH12. The thirteenth source electrode S13 and the thirteenth drain electrode D13 may not overlap the thirteenth gate electrode G13 in the third direction DR3.

The fourteenth transistor T14 includes a fourteenth channel CH14, a fourteenth gate electrode G14, a fourteenth source electrode S14, and a fourteenth drain electrode D14. The fourteenth channel CH14 may overlap the fourteenth gate electrode G14 in the third direction DR3. The fourteenth gate electrode G14 may be integrally formed with the fourth gate connection electrode GCE4. The fourteenth source electrode S14 may be disposed on one side of the fourteenth channel CH14, and the fourteenth drain electrode D14 may be disposed on the other side of the fourteenth channel CH14. The fourteenth source electrode S14 may be connected to the seventh data connection electrode DCE7 through the tenth active contact holes ACH10. The fourteenth drain electrode D14 may be connected to the fourth data connection electrode DCE4 through a twelfth active contact hole ACH12. The fourteenth source electrode S14 and the fourteenth drain electrode D14 may not overlap the fourteenth gate electrode G14 in the third direction DR3.

The fifteenth transistor T15 includes a fifteenth channel CH15, a fifteenth gate electrode G15, a fifteenth source electrode S15, and a fifteenth drain electrode D15. The fifteenth channel CH15 may overlap the fifteenth gate electrode G15 in the third direction DR3. The fifteenth gate electrode G15 may be integrally formed with a sixth capacitor electrode CE6. The fifteenth source electrode S15 may be disposed on one side of the fifteenth channel CH15, and the fifteenth drain electrode D15 may be disposed on the other side of the fifteenth channel CH15. The fifteenth source electrode S15 may be connected to a ninth data connection electrode DCE9 through a fifteenth active contact hole ACH15. The fifteenth drain electrode D15 may be connected to a seventeenth source electrode S17. The fifteenth source electrode S15 and the fifteenth drain electrode D15 may not overlap the fifteenth gate electrode G15 in the third direction DR3.

The eleventh sub-transistor T161 of the sixteenth transistor T16 includes an eleventh sub-channel CH161, an eleventh sub-gate electrode G161, an eleventh sub-source electrode S161, and an eleventh sub-drain electrode D161. The eleventh sub-channel CH161 may overlap the eleventh sub-gate electrode G161 in the third direction DR3. The eleventh sub-gate electrode G161 may be integrally formed with the fifth gate connection electrode GCE5. The eleventh sub-source electrode S161 may be disposed on one side of the eleventh sub-channel CH161, and the eleventh sub-drain electrode D161 may be disposed on the other side of the eleventh sub-channel CH161. The eleventh sub-source electrode S161 may be connected to the eighth data connection electrode DCE8 through a seventeenth active contact hole ACH17, and the eleventh sub-drain electrode D161 may be connected to a twelfth sub-source electrode S162. The eleventh sub-source electrode S161 and the eleventh sub-drain electrode D161 may not overlap the eleventh sub-gate electrode G161.

The twelfth sub-transistor T162 of the sixteenth transistor T16 includes a twelfth sub-channel CH162, a twelfth sub-gate electrode G162, a twelfth sub-source electrode S162, and a twelfth sub-drain electrode D162. The twelfth sub-channel CH162 may overlap the twelfth sub-gate electrode G162 in the third direction DR3. The twelfth sub-gate electrode G162 may be integrally formed with the fifth gate connection electrode GCE5. The twelfth sub-source electrode S162 may be disposed on one side of the twelfth sub-channel CH162, and the twelfth sub-drain electrode D162 may be disposed on the other side of the twelfth sub-channel CH162. The twelfth sub-source electrode S162 may be connected to the eleventh sub-drain electrode D161, and the twelfth sub-drain electrode D162 may be connected to the initialization voltage line VIL through an eighteenth active contact hole ACH18. The twelfth sub source electrode S162 and the twelfth sub drain electrode D162 may not overlap the twelfth sub gate electrode G162.

The seventeenth transistor T17 includes a seventeenth channel CH17, a seventeenth gate electrode G17, a seventeenth source electrode S17, and a seventeenth drain electrode D17. The seventeenth channel CH17 may overlap the seventeenth gate electrode G17 in the third direction DR3. The seventeenth gate electrode G17 may be integrally formed with a seventh gate connection electrode GCE7. The seventeenth source electrode S17 may be disposed on one side of the seventeenth channel CH17, and the seventeenth drain electrode D17 may be disposed on the other side of the seventeenth channel CH17. The seventeenth source electrode S17 may be connected to the fifteenth drain electrode D15. The seventeenth drain electrode D17 may be connected to the first anode connection electrode ANDE1 through a nineteenth active contact hole ACH19. The seventeenth source electrode S17 and the seventeenth drain electrode D17 may not overlap the seventeenth gate electrode G17 in the third direction DR3.

The eighteenth transistor T18 includes an eighteenth channel CH18, an eighteenth gate electrode G18, an eighteenth source electrode S18, and an eighteenth drain electrode D18. The eighteenth channel CH18 may overlap the eighteenth gate electrode G18 in the third direction DR3. The eighteenth gate electrode G18 may be integrally formed with the fifth gate connection electrode GCE5. The eighteenth source electrode S18 may be disposed on one side of the eighteenth channel CH18, and the eighteenth drain electrode D18 may be disposed on the other side of the eighteenth channel CH18. The eighteenth source electrode S18 may be connected to the first anode connection electrode ANDE1 through a nineteenth active contact holes ACH19. The eighteenth drain electrode D18 may be connected to an eleventh data connection electrode DCE11 through a twenty-first active contact hole ACH21. The eighteenth source electrode S18 and the eighteenth drain electrode D18 may not overlap the eighteenth gate electrode G18 in the third direction DR3.

The thirteenth sub-transistor T191 of the nineteenth transistor T19 includes a thirteenth sub-channel CH191, a thirteenth sub-gate electrode G191, a thirteenth sub-source electrode S191, and a thirteenth sub-drain electrode D191. The thirteenth sub-channel CH191 may overlap a thirteenth sub-gate electrode G191 in the third direction DR3. The thirteenth sub-gate electrode G191 may be integrally formed with an eighth gate connection electrode GCE8. The thirteenth sub-source electrode S191 may be disposed on one side of the thirteenth sub-channel CH191, and the thirteenth sub-drain electrode D191 may be disposed on the other side of the thirteenth sub-channel CH191. The thirteenth sub-source electrode S191 may be connected to the first anode connection electrode ANDE1 through the nineteenth active contact holes ACH19. The thirteenth sub-drain electrode D191 may be connected to a fourteenth sub-source electrode S192. The thirteenth sub-source electrode S191 and the thirteenth sub-drain electrode D191 may not overlap the thirteenth sub-gate electrode G191 in the third direction DR3.

The fourteenth sub-transistor T192 of the nineteenth transistor T19 includes a fourteenth sub-channel CH192, a fourteenth sub-gate electrode G192, a fourteenth sub-source electrode S192, and a fourteenth sub-drain electrode D192. The fourteenth sub-channel CH192 may overlap the fourteenth sub-gate electrode G192 in the third direction DR3. The fourteenth sub-gate electrode G192 may be integrally formed with the eighth gate connection electrode GCE8. The fourteenth sub-source electrode S192 may be disposed on one side of the fourteenth sub-channel CH192, and the fourteenth sub-drain electrode D192 may be disposed on the other side of the fourteenth sub-channel CH192. The fourteenth sub-source electrode S192 may be connected to the thirteenth sub-drain electrode D191. The fourteenth sub-drain electrode D192 may be connected to a tenth data connection electrode DCE10 through a twentieth active contact hole ACH20. The fourteenth sub-source electrode S192 and the fourteenth sub-drain electrode D192 may not overlap the fourteenth sub-gate electrode G192 in the third direction DR3.

The first capacitor electrode CE1 may be integrally formed with the first gate electrode G1.

The second capacitor electrode CE2 may be connected to the $k^{th}$ sweep signal line SWPLk through a first connection contact hole BCH1. The second capacitor electrode CE2 may overlap the first capacitor electrode CE1 in the third direction DR3.

The third capacitor electrode CE3 may be connected to the first gate electrode G1 through the first gate contact hole GCH1. The third capacitor electrode CE3 may be connected to the fourth sub-drain electrode D42 through the first active contact hole ACH1. The third capacitor electrode CE3 may overlap the second capacitor electrode CE2 in the third direction DR2.

The first capacitor electrode CE1 and the third capacitor electrode CE3 may be one electrode of the first capacitor C1, and the second capacitor electrode CE2 may be the other electrode of the first capacitor C1.

The fourth capacitor electrode CE4 may be integrally formed with the eighth gate electrode G8. The fourth capacitor electrode CE4 may be connected to the sixth data connection electrode DCE6 through a sixth gate contact hole GCH6.

A fifth capacitor electrode CE5 may be connected to the fourth data connection electrode DCE4 through the second connection contact hole BCH2. The fifth capacitor electrode CE5 may overlap the fourth capacitor electrode CE4 in the third direction DR3.

The fourth capacitor electrode CE4 may be one electrode of the second capacitor C2, and the fifth capacitor electrode CE5 may be the other electrode of the second capacitor C2.

The sixth capacitor electrode CE6 may be integrally formed with the fifteenth gate electrode G15. The sixth capacitor electrode CE6 may be connected to the eighth data connection electrode DCE8 through a ninth gate contact hole GCH9.

A seventh capacitor electrode CE7 may be connected to the initialization power supply line VIL through a tenth gate contact hole GCH10. The seventh capacitor electrode CE7 may overlap the sixth capacitor electrode CE6 in the third direction DR3.

The sixth capacitor electrode CE6 may be one electrode of the third capacitor C3, and the seventh capacitor electrode CE7 may be the other electrode of the third capacitor C3.

The first gate connection electrode GCE1 may be connected to the $k^{th}$ scan write line GWLk through a third gate contact hole GCH3. The second gate connection electrode GCE2 may be connected to the $k^{th}$ scan initialization line GILk through a second gate contact hole GCH2. The third gate connection electrode GCE3 may be connected to the $k^{th}$ PWM light emitting line PWELk through a fourth gate contact hole GCH4. The fourth gate connection electrode GCE4 may be connected to the $k^{th}$ PWM light emitting line PWELk through a fifth gate contact hole GCH5. The fifth gate connection electrode GCE5 may be connected to the $k^{th}$ scan write line GWLk through a seventh gate contact hole GCH7. The sixth gate connection electrode GCE6 may be connected to the $k^{th}$ scan control line GCLk through an eleventh contact hole GCH11. The seventh gate connection electrode GCE7 may be connected to the $k^{th}$ PAM light emitting line PAELk through a twelfth gate contact hole GCH12. The eighth gate connection electrode GCE8 may be connected to the test signal line TSTL through a thirteenth gate contact hole GCH13.

The first data connection electrode DCE1 may be connected to the second source electrode S2 through the second active contact hole ACH2. The second data connection electrode DCE2 may be connected to the eighth source electrode S8 through the sixth active contact hole ACH6 and connected to the tenth sub-drain electrode D122 through an eleventh active contact hole ACH11. A third data connection electrode DCE3 may be connected to the eighth drain electrode D8 through a seventh active contact hole ACH7 and connected to the vertical connection electrode VCE through a fourth connection contact hole BCH4. The fourth data connection electrode DCE4 may be connected to the fifth capacitor electrode CE5 through the second connection contact hole BCH2 and connected to the thirteenth drain electrode D13 and the fourteenth drain electrode D14 through the twelfth active contact hole ACH12. The fifth data connection electrode DCE5 may be connected to the ninth source electrode S9 through the eighth active contact hole ACH8. The sixth data connection electrode DCE6 may be connected to the fifth sub-source electrode S101 and the eighth sub-drain electrode D112 through the ninth active contact hole ACH9.

The seventh data connection electrode DCE7 may be connected to the ninth sub-source electrode S121, the tenth sub-source electrode S122, and the fourteenth source electrode S14 through a tenth active contact hole ACH10. The eighth data connection electrode DCE8 may be connected to the sixth capacitor electrode CE6 through the ninth gate contact hole GCH9 and connected to the eleventh sub-source electrode S161 and the sixth drain electrode D6 through the seventeenth active contact hole ACH17. The ninth data connection electrode DCE9 may be connected to the vertical connection electrode VCE through a third connection contact hole BCH3 and connected to the fifteenth source electrode S15 through the fifteenth active contact hole ACH15. The tenth data connection electrode DCE10 may be connected to the fourteenth sub-drain electrode D192 through the twentieth active contact hole ACH20 and may be electrically connected to the third power supply line VSL through a first power supply contact hole PCH1. The eleventh data connection electrode DCE11 may be connected to the eighteenth drain electrode D18 through the twenty-first active contact hole ACH21 and may be electrically connected to the initialization power supply line VIL through a second power contact hole PCH2. The twelfth data connection electrode DCE12 may be connected to the fifteenth drain electrode D15 and the seventeenth source electrode S17 through a sixteenth active contact hole ACH16.

The vertical connection electrode VCE may be extended in the second direction DR2. The vertical connection electrode VCE may be connected to the ninth data connection electrode DCE9 through the third connection contact hole BCH3 and connected to the third data connection electrode DCE3 through the fourth connection contact hole BCH4.

The first anode connection electrode ANDE1 may be connected to the seventeenth drain electrode D17 through the nineteenth active contact hole ACH19 and connected to a second anode connection electrode ANDE2 through a first anode contact hole ANCT1.

In one or more embodiments, power supply connection electrode VSE may be connected to the eleventh data connection electrode DCE11 through a first power supply contact hole PCH1.

As shown in FIGS. 7 to 11, because the eighth gate electrode G8 of the eighth transistor T8 does not overlap the signal line, the influence of the eighth gate electrode G8 by the voltage change of the signal line may be reduced or minimized.

In addition, the twelfth transistor T12 includes a ninth sub-transistor T121 and a tenth sub-transistor T122 connected in parallel. Specifically, not only is the tenth sub-drain electrode D122 of the tenth sub-transistor T122 connected to the tenth source electrode S8, but the ninth sub-drain electrode D121 of the ninth sub-transistor T122 may be connected to the eighth source electrode S8 through the second data connection electrode DCE2. Therefore, the path for the current to flow from the second power supply line VDL2 to the first electrode of the eighth transistor T8 may be increased, and accordingly, the current from the second power supply line VDL2 to the first electrode of the eighth transistor T8 may flow more smoothly.

On the other hand, the layout of the second sub-pixel SP2 may be substantially the same as the layout of the first sub-pixel SP1 except that the second PAM data line GDL is arranged instead of the first PAM data line RDL. The layout of the third sub-pixel SP3 may be substantially the same as the layout of the first sub-pixel SP1, except that the third PAM data line BDL is arranged instead of the first PAM data line RDL. Therefore, the layout of the second sub-pixel SP2 and the layout of the third sub-pixel SP3 are omitted.

Figure 12:
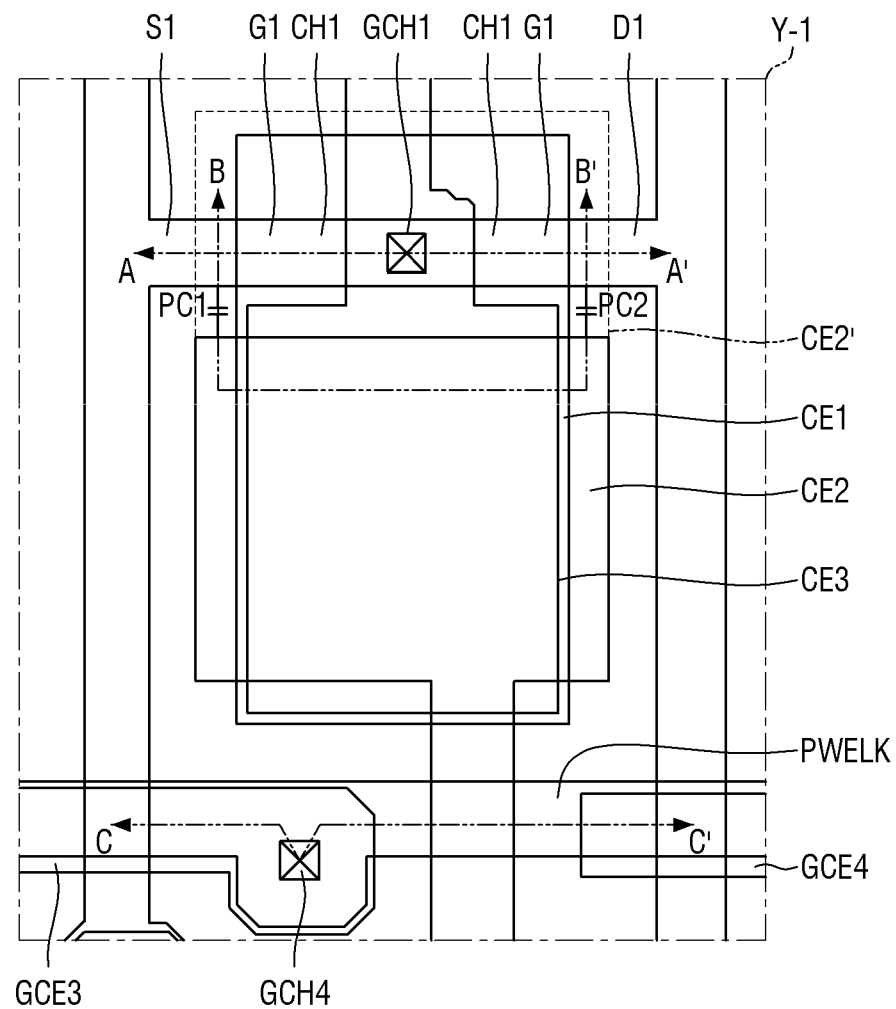
FIG. 12 is an enlarged layout view illustrating one example of an area Y-1 of FIGS. 9 and 10.

FIG. 12 is an enlarged layout view illustrating one example of an area Y-1 of FIGS. 9 and 10.

In FIG. 12, the first gate electrode G1, the first channel CH1, the first source electrode S1, and the first drain electrode D1 of the first transistor T1, the first capacitor electrode CE1 of the first capacitor C1, a second capacitor electrode CE2, and the third capacitor electrode CE3, the third gate connection electrode GCE3, the fourth gate connection electrode GCE4, and the $k^{th}$ PWM light emitting line PWELk are illustrated.

Referring to FIG. 12, the first capacitor electrode CE1, the second capacitor electrode CE2, and the third capacitor electrode CE3 may be stacked in the third direction DR3.

The first capacitor electrode CE1 is integrally formed with the first gate electrode G1, and the third capacitor electrode CE3 is connected to the first gate electrode G1 through the first gate contact hole GCH1, so that the first gate electrode G1, the first capacitor electrode CE1, and the third capacitor electrode CE3 may have the same potential.

In contrast, the second capacitor electrode CE2 may be electrically separated from the first gate electrode G1, the first capacitor electrode CE1, and the third capacitor electrode CE3. For example, the second capacitor electrode CE2 may be connected to the $k^{th}$ sweep signal line SWPLk through the first connection contact hole BCH1, as described in FIGS. 7 to 11.

Accordingly, the first capacitor electrode CE1 and the third capacitor electrode CE3 serve as the first electrode of the first capacitor C1, and the second capacitor electrode CE2 serves as the other electrode of the first capacitor C1.

When the second capacitor electrode CE2 is extended to cover the dotted line portion CE2' and the first capacitor electrode CE1 shown in FIG. 12, the capacitance between the first capacitor electrode CE1 and the second capacitor electrode CE2 may be large. However, the first parasitic capacitor PC1 may be formed between the second capacitor electrode CE2 and the first source electrode S1, and the second parasitic capacitor PC2 may be formed between the second capacitor electrode CE2 and the second source electrode S2 by overlapping the second capacitor electrode CE2 with the first source electrode S1 and the first drain electrode D1 of the first transistor T1. The second capacitor electrode CE2 is connected to the $k^{th}$ sweep signal line SWPLk, and pulses of the $k^{th}$ sweep signal SWPk are generated at each of the plurality of light emitting periods EP1, EP2, ..., EPn during the one frame period. Therefore, the voltage variation of the $k^{th}$ sweep signal line SWPLk is reflected on the first source electrode S1 of the first transistor T1 by the first parasitic capacitor PC1 for each of the plurality of light emitting periods EP1, EP2, ..., EPn of one frame period and the voltage variation of the $k^{th}$ sweep signal line SWPLk may be reflected on the first drain electrode D1 of the first transistor T1 by the second parasitic capacitor PC2. Accordingly, the control current of the first transistor T1 may be varied as the voltage between the first electrode and the gate electrode of the first transistor T1 is varied.

Accordingly, the second capacitor electrode CE2 may not overlap the first channel CH1, the first source electrode S1, and the first drain electrode D1 of the first transistor T1 in the third direction DR3 to reduce or minimize the first parasitic capacitor PC1 and the second parasitic capacitor PC2. That is, the capacity of the first parasitic capacitor PC1 may be greatly reduced by eliminating the overlap region between the second capacitor electrode CE2 and the first source electrode S1. Also, the capacity of the second parasitic capacitor PC2 may be significantly reduced by eliminating the overlap region between the second capacitor electrode CE2 and the first drain electrode D1. Therefore, the amount of voltage variation of the $k^{th}$ sweep signal line SWPLk by the first parasitic capacitor PC1 may be reduced or prevented from being reflected on the first source electrode S1 of the first transistor T1. Furthermore, the second parasitic capacitor PC2 may reduce or prevent the amount of voltage variation of the $k^{th}$ sweep signal line SWPLk from being reflected on the first drain electrode D1 of the first transistor T1.

The left side of the second capacitor electrode CE2 may protrude more than the left side of the first capacitor electrode CE1, and the right side of the second capacitor electrode CE2 may protrude more than the right side of the first capacitor electrode CE1. Also, the left side of the second capacitor electrode CE2 may protrude more than the left side of the third capacitor electrode CE3, and the right side of the second capacitor electrode CE2 may protrude more than the right side of the third capacitor electrode CE3.

A length of the first direction DR1 of the second capacitor electrode CE2 may be larger than a length of the first direction DR1 of the first capacitor electrode CE1. Also, the length of the first direction DR1 of the second capacitor electrode CE2 may be larger than the length of the first direction DR1 of the third capacitor electrode CE3. The difference between the length of the first direction DR1 of the second capacitor electrode CE2 and the length of the first direction DR1 of the first capacitor electrode CE1, and the difference between the length of the first direction DR1 of the second capacitor electrode CE2 and the length of the first direction DR1 of the third capacitor electrode CE3 may be greater than the process error of the second capacitor electrode CE2 in the first direction DR1. As a result, even if the second capacitor electrode CE2 is shifted left or right in the first direction DR1 by the process error, the overlap area of the first capacitor electrode CE1 and the second capacitor electrode CE2 and the overlap area of the second capacitor electrode CE2 and the third capacitor electrode CE3 may remain substantially the same. In other words, the capacity of the first capacitor C1 may be a non-variable capacity that does not change even if the process error occurs.

The second capacitor electrode CE2 may be disposed between the third gate connection electrode GCE3 and the fourth gate connection electrode GCE4 in the first direction DR1. In other words, because the second capacitor electrode CE2 is connected to the $k^{th}$ sweep signal line SWPLk, the third gate connection electrode GCE3 and the fourth gate connection electrode GCE4 may not overlap with the second capacitor electrode CE2 in the third direction DR3 to reduce or minimize being affected by the second capacitor electrode CE2.

Also, the first PWM light emitting line PWELk and the first power supply line VDL1 may overlap with the second capacitor electrode CE2 in the third direction DR3 with a small (e.g., minimum) area to reduce or minimize being affected by the second capacitor electrode CE2.

Figure 13:
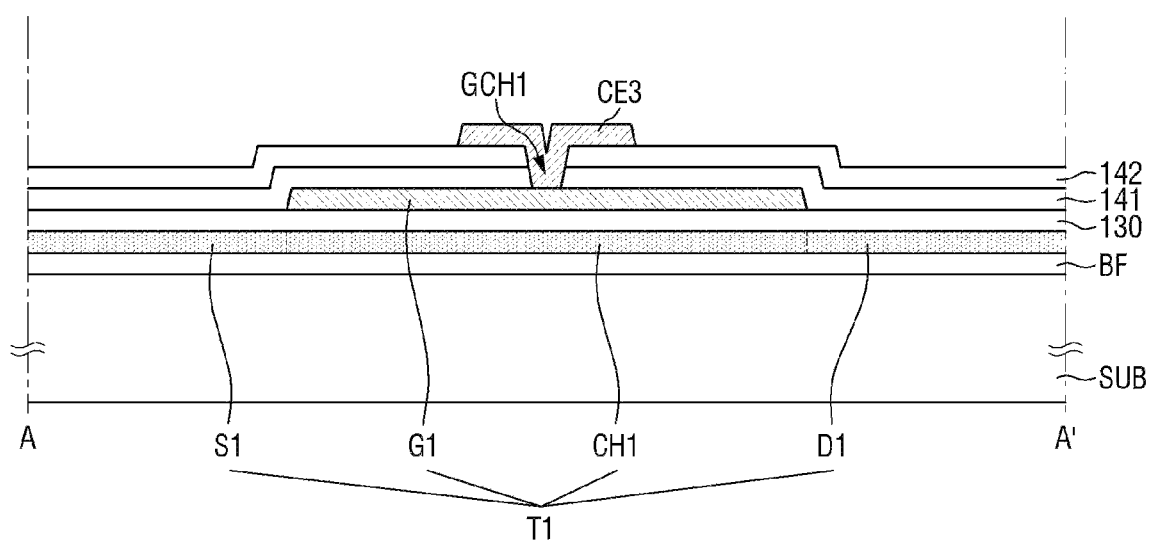
FIG. 13 is a cross-sectional view illustrating one example of a display panel taken along the line A-A' of FIG. 12.
Figure 14:
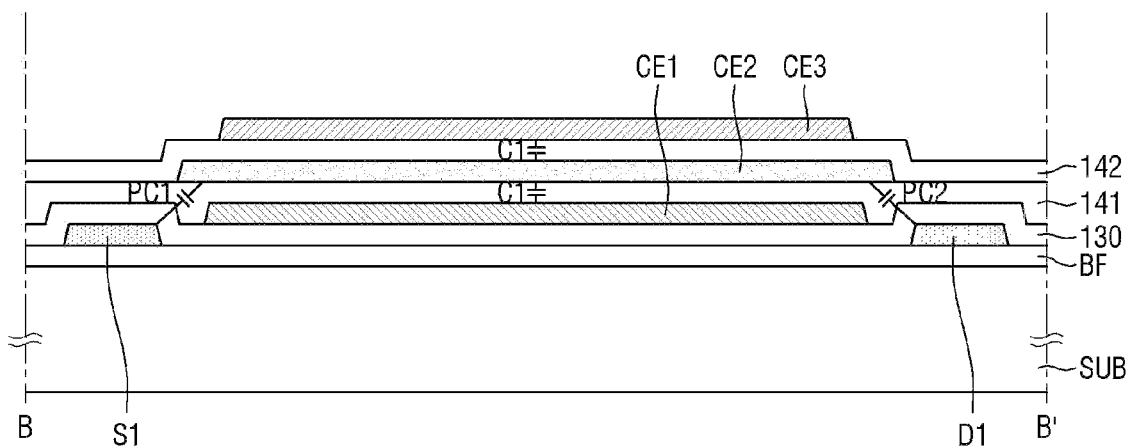
FIG. 14 is a cross-sectional view illustrating one example of a display panel taken along the line B-B' of FIG. 12.
Figure 15:
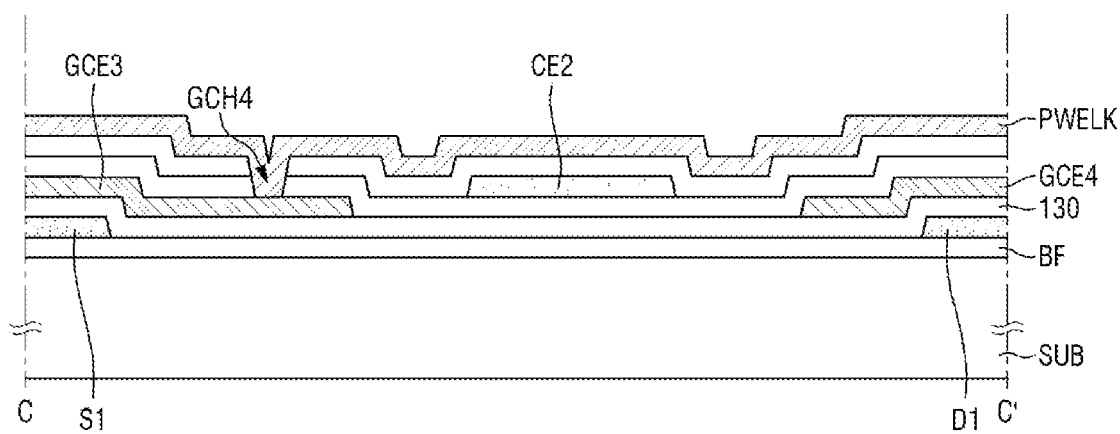
FIG. 15 is a cross-sectional view illustrating one example of a display panel taken along the line C-C' of FIG. 12.

FIG. 13 is a cross-sectional view illustrating one example of a display panel taken along the line A-A' of FIG. 12. FIG. 14 is a cross-sectional view illustrating one example of a display panel taken along the line B-B' of FIG. 12. FIG. 15 is a cross-sectional view illustrating one example of a display panel taken along the line C-C' of FIG. 12.

Referring to FIGS. 13 to 15, the substrate SUB may be made of an insulating material such as glass or polymer resin. For example, when the substrate SUB is made of a polymer resin, it may include polyimide. The substrate SUB may be a flexible substrate capable of bending, folding, rolling, or the like.

A buffer layer BF may be disposed on the substrate SUB. The buffer layer BF is a layer for protecting the transistors of a thin film transistor layer and a light emitting layer of the light emitting element layer from moisture penetrating through the substrate SUB, which is vulnerable to moisture permeation. The buffer layer BF may be formed of a plurality of inorganic layers alternately stacked. For example, the buffer layer BF may be formed as a multilayer in which one or more inorganic layers of a silicon nitride layer, a silicon oxynitride layer, a silicon oxide layer, a titanium oxide layer, and/or an aluminum oxide layer are alternately stacked.

The active layer may be disposed on a buffer film BF. The active layer may include channels (CH1, CH2, CH31, CH32, CH41, CH42, CH5, CH6, CH7, CH8, CH9, CH101, CH102, CH111, CH112, CH121, CH122, CH13, CH14, CH15, CH161, CH162, CH17, CH18, CH191, CH192), source electrodes (S1, S2, S31, S32, S41, S42, S5, S6, S7, S8, S9, S101, S102, S111, S112, S121, S122, S13, S14, S15, S161, S162, S17, S18, S191, S192), and drain electrodes (D1, D2, D31, D32, D41, D42, D5, D6, D7, D8, D9, D101, D102, D111, D112, D121, D122, D13, D14, D15, D161, D162, D17, D18, D191, D192) of the first to nineteenth transistors T1 to T19 described in FIGS. 7 to 11. The active layer may include polycrystalline silicon, single crystal silicon, low temperature polycrystalline silicon, amorphous silicon, and/or an oxide semiconductor.

The first channel CH1 of the first transistor T1 may overlap with the first gate electrode G1 in the third direction DR3. The first source electrode S1 and the first drain electrode D1 of the first transistors T1 may not overlap the first gate electrode G1 in the third direction DR3. The first source electrode S1 and the first drain electrode D1 of the first transistor T1 may be regions in which a silicon semiconductor or an oxide semiconductor is doped with ions or impurities to make it conductive.

A gate insulating film 130 may be disposed on the active layer ACT. The gate insulating film 130 may be formed from an inorganic film, such as a silicon nitride layer, a silicon oxynitride layer, a silicon oxide layer, a titanium oxide layer, and/or an aluminum oxide layer.

A first gate metal layer may be disposed on the gate insulating film 130. The first gate metal layer may include gate electrodes (G1, G2, G31, G32, G41, G42, G5, G6, G7, G8, G9, G101, G102, G111, G112, G121, G122, G13, G14, G15, G161, G162, G17, G18, G191, G192) of the first to nineteenth transistors T1 to T19, the first capacitor electrode CE1, the fourth capacitor electrode CE4, the sixth capacitor electrode CE6, and first to ninth gate connection electrodes GCE1 to GCE9. The first gate metal layer may be formed as a single layer or multiple layers of one or more of molybdenum (Mo), aluminum (Al), chromium (Cr), gold (Au), titanium (Ti), nickel (Ni), neodymium (Nd), and/or copper (Cu), and/or an alloy thereof.

A first interlayer insulating film 141 may be disposed on the first gate metal layer. The first interlayer insulating film 141 may be formed of an inorganic film, such as a silicon nitride layer, a silicon oxynitride layer, a silicon oxide layer, a titanium oxide layer, and/or an aluminum oxide layer.

A second gate metal layer may be disposed on the first interlayer insulating film 141. The second gate metal layer may include the second capacitor electrode CE2, the fifth capacitor electrode CE5, the seventh capacitor electrode CE7, and the vertical connection electrode VCE. The second gate metal layer may be formed as a single layer or multiple layers of one or more of molybdenum (Mo), aluminum (Al), chromium (Cr), gold (Au), titanium (Ti), nickel (Ni), neodymium (Nd), and/or copper (Cu), and/or an alloy thereof.

The second capacitor electrode CE2 may overlap the first capacitor electrode CE1 in the third direction DR3, the fourth capacitor electrode CE4 may overlap the third capacitor electrode CE3 in the third direction DR3, and the sixth capacitor electrode CE6 may overlap the fifth capacitor electrode CE5 in the third direction DR3. Because the first interlayer insulating film 141 has a suitable permittivity (e.g., a predetermined permittivity), the first capacitor C1 may be formed by the first capacitor electrode CE1, the second capacitor electrode CE2, and the first interlayer insulating film 141 disposed between them. Also, the second capacitor C2 may be formed by the fourth capacitor electrode CE4, the fifth capacitor electrode CE5, and the first interlayer insulating film 141 disposed between them. The third capacitor C3 may be formed by the sixth capacitor electrode CE6, the seventh capacitor electrode CE7, and the first interlayer insulating film 141 disposed between them.

A second interlayer insulating film 142 may be disposed on the second gate metal layer. The second interlayer insulating film 142 may be formed of an inorganic film, such as a silicon nitride layer, a silicon oxynitride layer, a silicon oxide layer, a titanium oxide layer, and/or an aluminum oxide layer.

A first source metal layer may be disposed on the second interlayer insulating film 142. The first source metal layer may include the initialization voltage line VIL, the $k^{th}$ scan initialization line GILk, the $k^{th}$ scan write line GWLk, the $k^{th}$ scan PWM light emitting line PWELk, and the first power supply line VDL1, the $k^{th}$ sweep signal line SWPLk, the $k^{th}$ scan control line GCLk, the gate off voltage line VGHL, the test signal line TSTL, and the $k^{th}$ PAM light emitting line PAELk. The first source metal layer may further include first to twelfth data connection electrode DCE1 to DCE12, the first anode connection electrode ANDE1, and the third capacitor electrode CE3. The first source metal layer may be formed as a single layer or multiple layers of one or more of molybdenum (Mo), aluminum (Al), chromium (Cr), gold (Au), titanium (Ti), nickel (Ni), neodymium (Nd), and/or copper (Cu), and/or an alloy thereof.

The third capacitor electrode CE3 may be connected to the first gate electrode G1 of the first transistor T1 through the first gate contact hole GCH1 penetrating the first interlayer insulating film 141 and the second interlayer insulating film 142. The $k^{th}$ PWM light emitting line PWELk may be connected to the third gate connection electrode GCE3 through the fourth gate contact hole GCH4 penetrating the first interlayer insulating film 141 and the second interlayer insulating film 142.

As shown in FIGS. 13 and 14, the third capacitor electrode CE3 is connected to the first capacitor electrode CE1 through the first gate contact hole GCH1, and the second capacitor electrode CE2 is disposed between the first capacitor electrode CE1 and the third capacitor electrode CE3. Therefore, the first capacitor C1 may be formed between the first capacitor electrode CE1 and the second capacitor electrode CE2 and between the second capacitor electrode CE2 and the third capacitor electrode CE3.

The second capacitor electrode CE2 does not overlap with the first source electrode S1 and the first drain electrode D1 to reduce the first parasitic capacitor PC1 and the second parasitic capacitor PC2. In this case, the overlap area of the first capacitor electrode CE1 and the second capacitor electrode CE2 may be reduced. It is possible to prevent the capacity of the first capacitor C1 from decreasing due to the decreased overlap area of the first capacitor electrode CE1 and the second capacitor electrode CE2 by forming the first capacitor C1 between the second capacitor electrode CE2 and the third capacitor electrode CE3.

Figure 16:
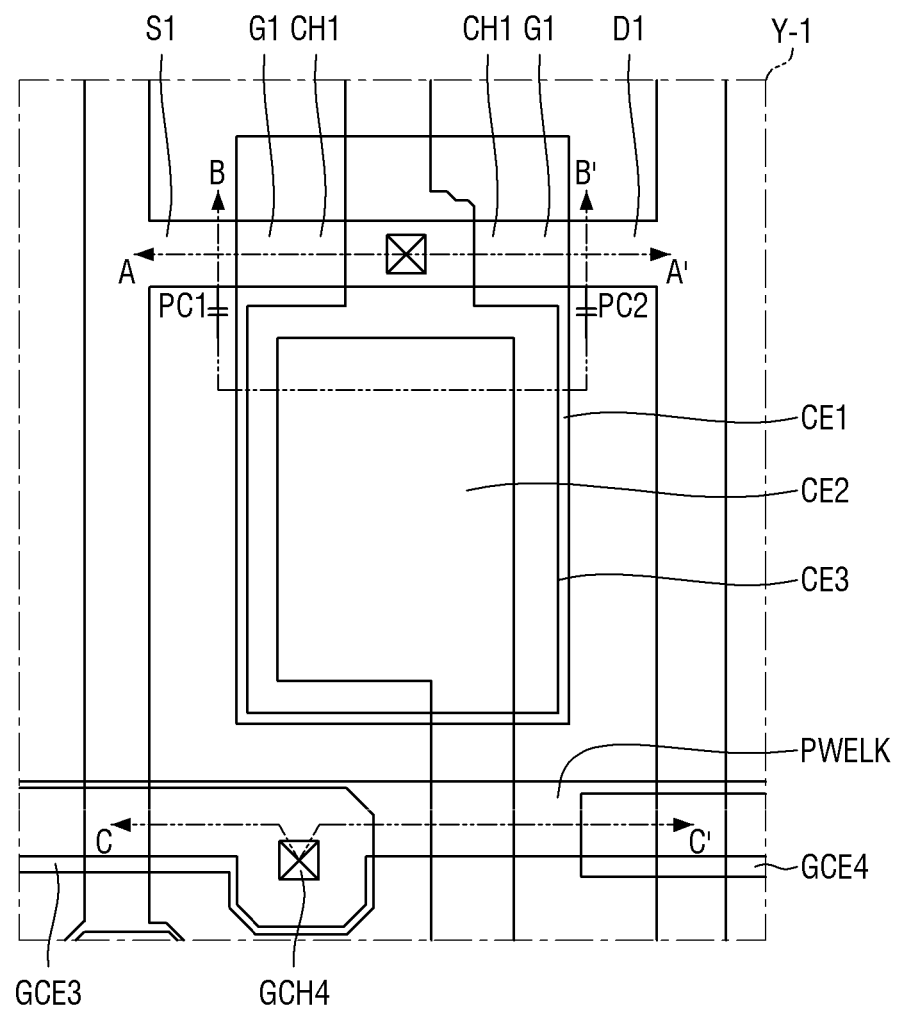
FIG. 16 is an enlarged layout view illustrating another example of the area Y-1 of FIGS. 9 and 10.

FIG. 16 is an enlarged layout view illustrating another example of the area Y-1 of FIGS. 9 and 10.

The embodiment of FIG. 16 differs from the embodiment of FIG. 12 in that the length of the first direction DR1 of the second capacitor electrode CE2 is changed. In FIG. 16, the differences from the embodiment of FIG. 12 will be mainly described.

Referring to FIG. 16, the left side of the first capacitor electrode CE1 may protrude more than the left side of the second capacitor electrode CE2, and the right side of the first capacitor electrode CE1 may protrude more than the right side of the second capacitor electrode CE2. Also, the left side of the third capacitor electrode CE3 may protrude more than the left side of the second capacitor electrode CE2, and the right side of the third capacitor electrode CE3 may protrude more than the right side of the second capacitor electrode CE2.

The length of the first direction DR1 of the second capacitor electrode CE2 may be smaller than the length of the first direction DR1 of the first capacitor electrode CE1. Also, the length of the first direction DR1 of the second capacitor electrode CE2 may be smaller than the length of the first direction DR1 of the third capacitor electrode CE3. The difference between the length of the first direction DR1 of the second capacitor electrode CE2 and the length of the first direction DR1 of the first capacitor electrode CE1 and the difference between the length of the first direction DR1 of the second capacitor electrode CE2 and the length of the first direction DR1 of the third capacitor electrode CE3 may be greater than the process error of the second capacitor electrode CE2 in the first direction DR1. As a result, even if the second capacitor electrode CE2 is shifted left or right in the first direction DR1 by the process error, the overlap area of the first capacitor electrode CE1 and the second capacitor electrode CE2 and the overlap area of the second capacitor electrode CE2 and the third capacitor electrode CE3 may remain substantially the same. In other words, the capacity of the first capacitor C1 may be a non-variable capacity that does not change even if the process error occurs.

Figure 17:
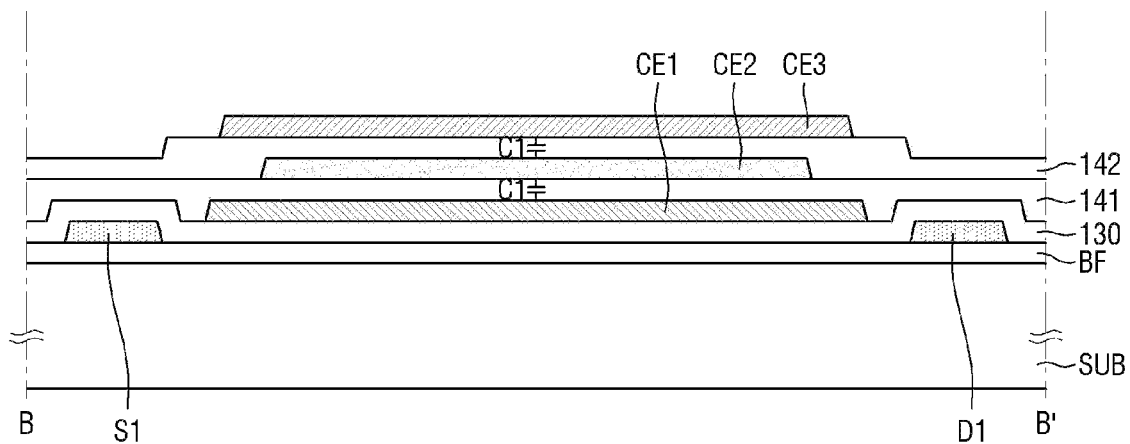
FIG. 17 is a cross-sectional view illustrating one example of a display panel taken along the line B-B' of FIG. 16.

FIG. 17 is a cross-sectional view illustrating one example of a display panel taken along the line B-B' of FIG. 16.

Referring to FIG. 17, because the length of the first direction DR1 of the second capacitor electrode CE2 is smaller than the length of the first direction DR1 of the first capacitor electrode CE1, the first capacitor electrode CE1 may serve to block or shield the coupling between the second capacitor electrode CE2 and the first source electrode S1 and the coupling between the second capacitor electrode CE2 and the first drain electrode D1. Therefore, the first parasitic capacitor PC1 formed between the second capacitor electrode CE2 and the first source electrode S1 and the second parasitic capacitor PC2 formed between the second capacitor electrode CE2 and the first drain electrode D1 may be further reduced.

Figure 18:
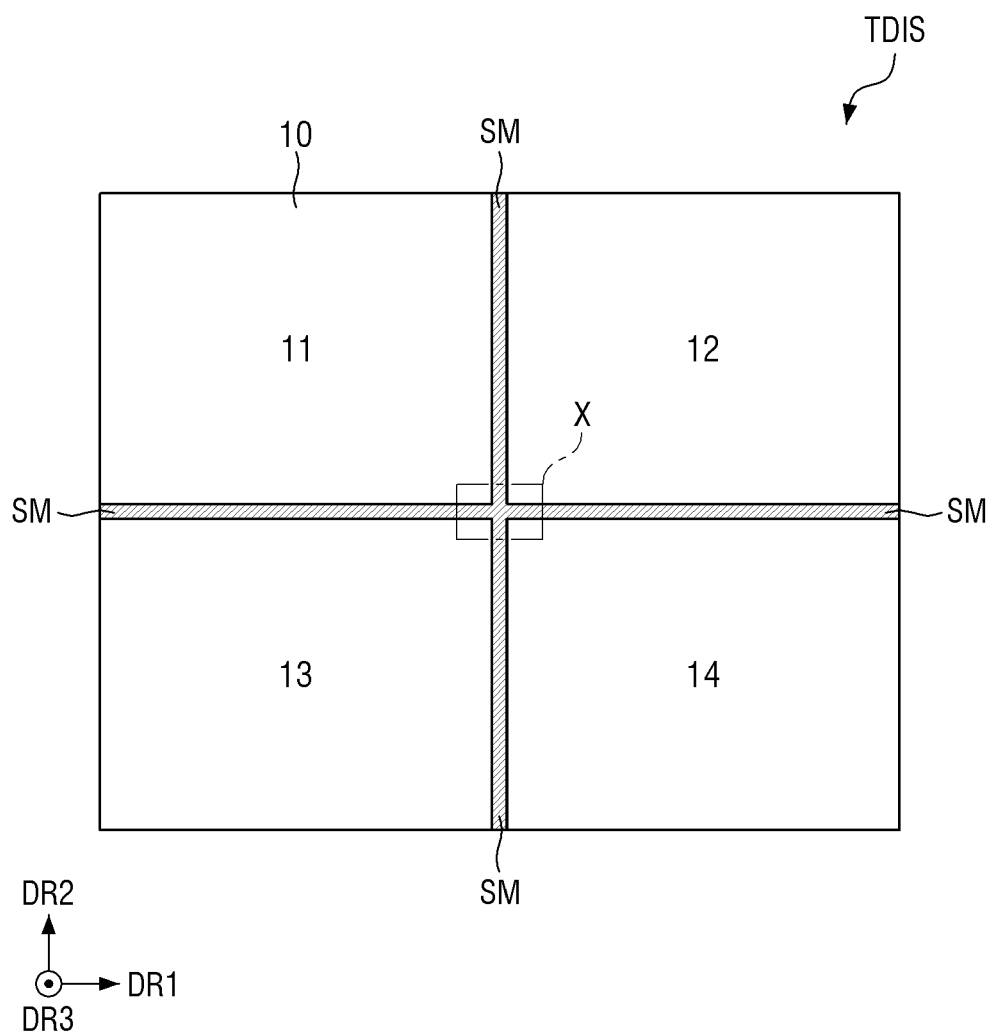
FIG. 18 is a perspective view illustrating a tiled display device including a plurality of display devices according to one or more embodiments.

FIG. 18 is a perspective view illustrating a tiled display device including a plurality of display devices according to one or more embodiments.

Referring to FIG. 18, a tiled display device TDIS may include a plurality of display devices 11, 12, 13, and 14, and a connection member SM. The plurality of display devices 11, 12, 13, and 14 may be arranged in a matrix form in M (M is a positive integer) number of rows and N (N is a positive integer) number of columns. For example, the tiled display device TDIS may include a first display device 11, a second display device 12, a third display device 13, and a fourth display device 14.

The first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TDIS are not limited to those illustrated in FIG. 18. The number and arrangement of the display devices 11, 12, 13, and 14 in the tiled display device TDIS may be determined in response to the size of the display device 10 and the tiled display device TDIS, and the shape of the tiled display device TDIS.

The plurality of display devices 11, 12, 13, and 14 may have the same size as each other, but embodiments of the present disclosure are not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be disposed such that the long sides or the short sides thereof are connected to each other. Some or all of the plurality of display devices 11, 12, 13, and 14 may be disposed at the edge of the tiled display device TDIS and may be disposed one side of the tiled display device TDIS. At least one of the plurality of display devices 11, 12, 13, and 14 may be disposed at least one corner of the tiled display device TDIS and may be formed two adjacent sides of the tiled display device TDIS. At least one of the plurality of display devices 11, 12, 13, and 14 may be surrounded by other display devices.

Each of the plurality of display devices 11, 12, 13, and 14 may be substantially the same as the display device 10 described with reference to FIG. 1. Therefore, a description of each of the plurality of display devices 11, 12, 13, and 14 will be omitted.

The connection member SM may include a coupling member or an adhesive member. In this case, the plurality of display devices 11, 12, 13, and 14 may be connected to each other by the coupling member or the adhesive member of the connection member SM. The connection member SM may be disposed between the first display device 11 and the second display device 12, between the first display device 11 and the third display device 13, between the second display device 12 and the fourth display device 14, and between the third display device 13 and the fourth display device 14.

Figure 19:
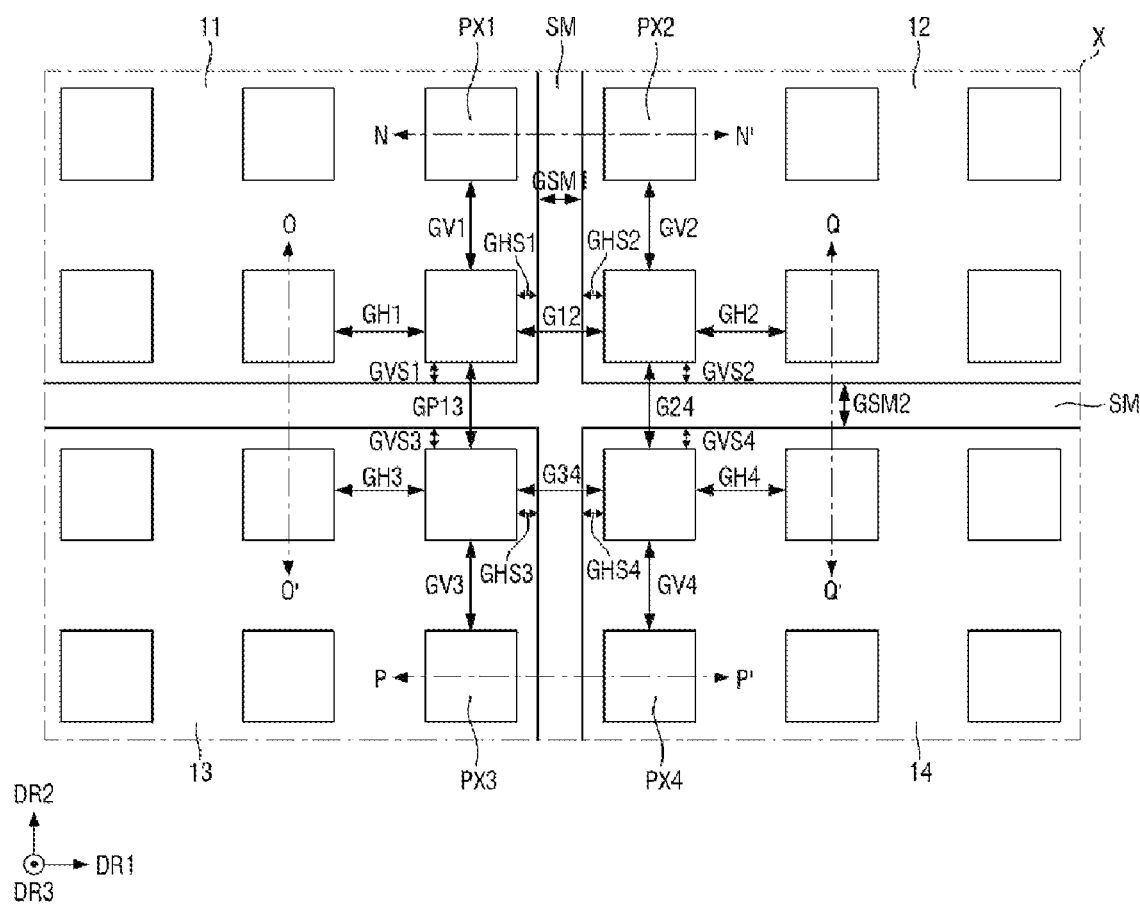
FIG. 19 is an enlarged layout view illustrating an area X of FIG. 18 in detail.

FIG. 19 is an enlarged layout view illustrating an area X of FIG. 18 in detail.

Referring to FIG. 19, the connection member SM may have a planar shape of a cross, or a plus sign in a central area of the device TDIS in which the first display device 11, the second display device 12, the third display device 13, and the fourth display device 14 are adjacent to each other. The connection member SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form along the first direction DR1 and the second direction DR2 to display an image. The second display device 12 may include second pixels PX2 arranged in a matrix along the first direction DR1 and the second direction DR2 to display an image. The third display device 13 may include third pixels PX3 arranged in a matrix along the first direction DR1 and the second direction DR2 to display an image. The fourth display device 14 may include fourth pixels PX4 arranged in a matrix along the first direction DR1 and the second direction DR2 to display an image.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The connection member SM may be disposed between the first pixel PX1 and the second pixel PX2 adjacent in the first direction DR1. A minimum distance G12 between the first pixels PX1 and the second pixels PX2 adjacent in the first direction DR1 may be the sum of the minimum distance GHS1 between the first pixel PX1 and the connection member SM in the first direction DR1, the minimum distance GHS2 between the second pixel PX2 and the connection member SM in the first direction DR1 and a width GSM1 of the connection member SM in the first direction DR1.

The minimum distance G12 between the first pixel PX1 and the second pixel PX2 adjacent in the first direction DR1, the first horizontal separation distance GH1, and the second horizontal separation distance GH2 may be substantially the same. To this end, the minimum distance GHS1 between the first pixel PX1 and the connection member SM in the first direction DR1 may be smaller than the first horizontal separation distance GH1, and the minimum distance GHS2 between the second pixel PX2 and the connection member SM in the first direction DR1 may be smaller than the second horizontal separation distance GH2. Further, the width GSM1 of the connection member SM in the first direction DR1 may be smaller than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be substantially the same.

The connection member SM may be disposed between the third pixel PX3 and the fourth pixel PX4 adjacent in the first direction DR1. A minimum distance G34 between the third pixel PX3 and the fourth pixel PX4 adjacent in the first direction DR1 may be the sum of a minimum distance GHS3 between the third pixel PX3 and the connection member SM in the first direction DR1, a minimum distance GHS4 between the fourth pixel PX4 and the connection member SM in the second direction DR1, and the width GSM1 of the connection member SM in the second direction DR1.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the connection member SM in the first direction DR1 may be smaller than the third horizontal separation distance GH3, and the minimum distance GHS4 between the fourth pixel PX4 and the connection member SM in the first direction DR1 may be smaller than the fourth horizontal separation distance GH4. Further, in the first direction DR1, the width GSM1 of the connection member SM may be smaller than the third horizontal separation distance GH3 or the fourth horizontal separation distance GH4.

The minimum distance between the first pixels PX1 adjacent in the second direction DR2 may be defined as a first vertical separation distance GV1, and the minimum distance between the third pixels PX3 adjacent in the second direction DR2 may be defined as a third vertical separation distance GV3. The first vertical separation distance GV1 and the third vertical separation distance GV3 may be substantially the same.

The connection member SM may be disposed between the first pixel PX1 and the third pixel PX3 adjacent in the second direction DR2. A minimum distance GP13 between the first pixel PX1 and the third pixel PX3 adjacent in the second direction DR2 may be the sum of a minimum distance GVS1 between the first pixel PX1 and the connection member SM in the second direction DR2, a minimum distance GVS3 between the third pixel PX3 and the connection member SM in the second direction DR2, and a width GSM2 of the connection member SM in the second direction DR2.

The minimum distance GP13 between the first pixel PX1 and the third pixel PX3 adjacent in the second direction DR2, the first vertical separation distance GV1, and the third vertical separation distance GV3 may be substantially the same.

To this end, the minimum distance GVS1 between the first pixel PX1 and the connection member SM in the second direction DR2 may be smaller than the first vertical separation distance GV1, and the minimum distance GVS3 between the third pixel PX3 and the connection member SM in the second direction DR2 may be smaller than the third vertical separation distance GV3. Further, in the second direction DR2, the width GSM2 of the connection member SM may be smaller than the first vertical separation distance GV1 or the third vertical separation distance GV3.

The minimum distance between the adjacent second pixels PX2 in the second direction DR2 may be defined as a second vertical separation distance GV2, and the minimum distance between the fourth pixels PX4 adjacent in the second direction DR2 may be defined as a fourth vertical separation distance GV4. The second vertical separation distance GV2 and the fourth vertical separation distance GV4 may be substantially the same.

The connection member SM may be disposed between the second pixel PX2 and the fourth pixel PX4 adjacent in the second direction DR2. The minimum distance G24 between the second pixel PX2 and the fourth pixel PX4 adjacent in the second direction DR2 may be the sum of the minimum distance GVS2 between the second pixel PX2 and the connection member SM in the second direction DR2, the minimum distance GVS4 between the fourth pixel PX4 and the joint SM in the second direction DR2, and the distance GSM2 of the connection member SM in the second direction DR2.

A minimum distance G24 between the second pixel PX2 and the fourth pixel PX4 adjacent in the second direction DR2, a second vertical separation distance GV2, and a fourth vertical separation distance GV4 may be substantially the same. To this end, a minimum distance GVS2 between the second pixel PX2 and the connection member SM in the second direction DR2 may be smaller than the second vertical separation distance GV2, and a minimum distance GVS4 between the fourth pixel PX4 and the connection member SM in the second direction DR2 may be smaller than the fourth vertical separation distance GV4. Further, in the second direction DR2, the width GSM2 of the connection member SM may be smaller than the second vertical separation distance GV2 or the fourth vertical separation distance GV4.

As shown FIGS. 19, the minimum distance between pixels of adjacent display devices may be substantially equal to the minimum distance between each of the pixels to prevent the connection member SM from being recognized between images displayed by the plurality of display devices 11, 12, 13, and 14.

Figure 20:
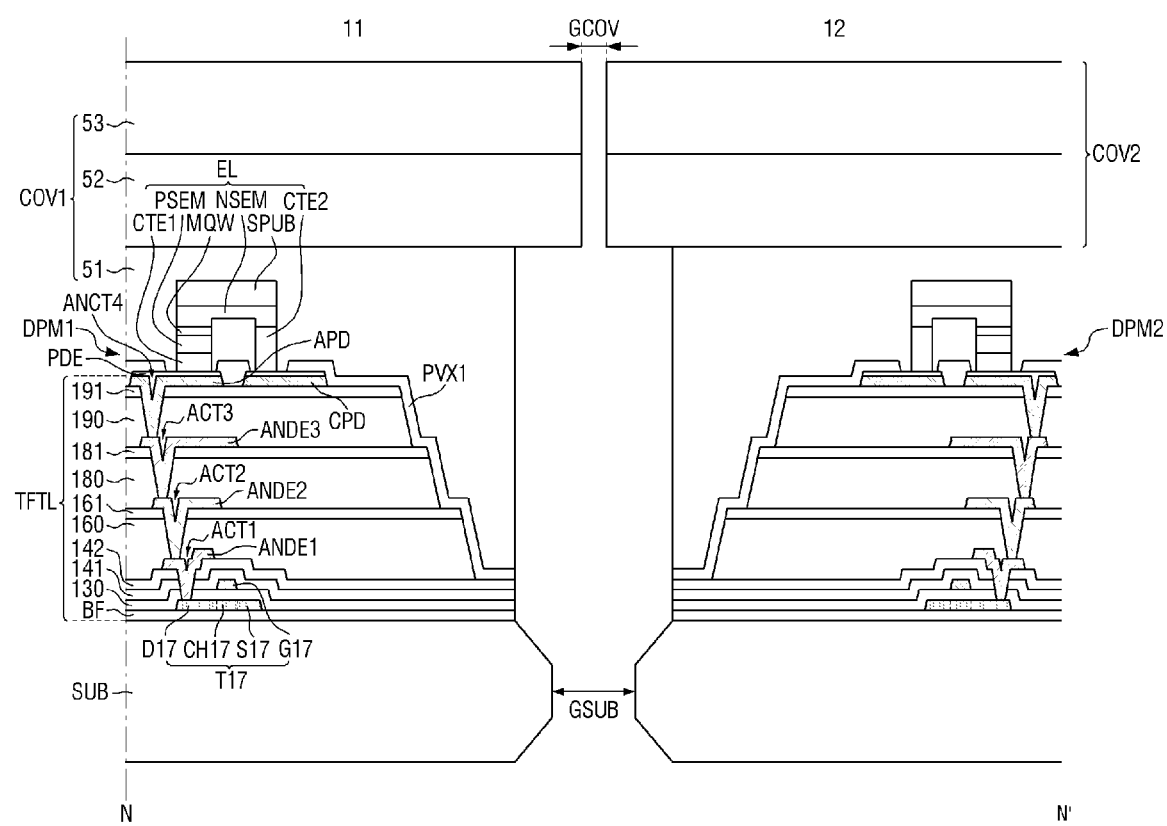
FIG. 20 is a cross-sectional view illustrating one example of a tiled display device taken along the line N-N' of FIG. 19.

FIG. 20 is a cross-sectional view illustrating one example of a tiled display device taken along the line N-N' of FIG. 19.

Referring to FIG. 20, the first display device 11 includes a first display module DPM1 and a first front cover COV1. The second display device 12 includes a second display module DPM2 and a second front cover COV2.

Each of the first display module DPM1 and the second display module DPM2 includes a substrate SUB, a thin film transistor layer TFTL, and light emitting elements EL.

Referring to FIG. 20, the display panel 100 may include the thin film transistor layer TFTL and the light emitting elements EL disposed on the substrate SUB. The thin film transistor layer TFTL may be a layer in which thin film transistors TFT are formed. The thin film transistors may include the first to nineteenth transistors T1 to T19 shown in FIGS. 5 to 11.

The thin film transistor layer TFTL includes the active layer, the first gate metal layer, the second gate metal layer, the first source metal layer, a second source metal layer, a third source metal layer, a fourth source metal layer, and a transparent metal layer. The thin film transistor layer TFTL also includes the buffer film BF, the gate insulating film 130, the first interlayer insulating film 141, the second interlayer insulating film 142, a first planarization film 160, a first inorganic insulating film 161, a second planarization film 180, a second inorganic insulating film 181, a third planarization film 190, a third inorganic insulating film 191, and a protective film PVX1.

The active layer, the first gate metal layer, the second gate metal layer, the first source metal layer, the buffer film BF, the gate insulating film 130, the first interlayer insulating film 141, the second interlayer insulating film 142 have been previously described in connection with FIGS. 13 to 15, so duplicate description is omitted.

The first planarization film 160 may be disposed on the first source metal layer. The first planarization film 160 may be formed from an organic film such as an acrylic resin, an epoxy resin, a phenolic resin, a polyamide resin, a polyimide resin, and/or the like.

The first inorganic insulating film 161 may be disposed on the first planarization film 160. The first inorganic insulating film 161 may be formed of an inorganic film, such as a silicon nitride layer, a silicon oxynitride layer, a silicon oxide layer, a titanium oxide layer, or an aluminum oxide layer.

The second source metal layer may be disposed on the first inorganic insulating film 161. The second source metal layer may include the second anode connection electrode ANDE2. The second anode connection electrode ANDE2 may be connected to the first anode connection electrode ANDE1 through a second anode contact hole ACT2 penetrating the first planarization film 160 and the first inorganic insulating film 161. The second source metal layer may be formed as a single layer or multiple layers of one or more of molybdenum (Mo), aluminum (Al), chromium (Cr), gold (Au), titanium (Ti), nickel (Ni), neodymium (Nd), and/or copper (Cu), and/or an alloy thereof.

The second planarization film 180 may be disposed on the second source metal layer DTL2. The second planarization film 180 may be formed of an organic film, such as an acrylic resin, an epoxy resin, a phenolic resin, a polyamide resin, a polyimide resin, and/or the like.

The second inorganic insulating film 181 may be disposed on the second planarization film 180. The second inorganic insulating film 181 may be formed of an inorganic film, such as a silicon nitride layer, a silicon oxynitride layer, a silicon oxide layer, a titanium oxide layer, and/or an aluminum oxide layer.

The third source metal layer may be disposed on the second inorganic insulating film 181. The third source metal layer may include a third anode connection electrode ANDE3. The third anode connection electrode ANDE3 may be connected to the second anode connection electrode ANDE2 through a third anode contact hole ACT3 penetrating the second planarization film 180 and the second inorganic insulating film 181. The third source metal layer may be formed as a single layer or multiple layers of one or more of molybdenum (Mo), aluminum (Al), chromium (Cr), gold (Au), titanium (Ti), nickel (Ni), neodymium (Nd), and/or copper (Cu), and/or an alloy thereof.

The third planarization film 190 may be disposed on the third source metal layer. The third planarization film 190 may be formed from an organic film such as an acrylic resin, an epoxy resin, a phenolic resin, a polyamide resin, a polyimide resin, and/or the like.

The third inorganic insulating film 191 may be disposed on the third planarization film 190. The third inorganic insulating film 191 may be formed of an inorganic film, such as a silicon nitride layer, a silicon oxynitride layer, a silicon oxide layer, a titanium oxide layer, and/or an aluminum oxide layer.

The fourth source metal layer may be disposed on the third inorganic insulating film 191. The fourth source metal layer may include an anode pad electrode APD and a cathode electrode CPD. The anode pad electrode APD may be connected to the third anode connection electrode ANDE3 through a fourth anode contact hole ANCT4 penetrating the third planarization film 190 and the third inorganic insulating film 191. The cathode electrode CPD is not shown but may be electrically connected to the third power supply line VSL. The anode pad electrode APD and cathode electrode CPD may be formed as a single layer or multiple layers of one or more of molybdenum (Mo), aluminum (Al), chromium (Cr), gold (Au), titanium (Ti), nickel (Ni), neodymium (Nd), and/or copper (Cu), and/or an alloy thereof.

The transparent metal layer may be disposed on the anode pad electrode APD and the cathode pad electrode CPD. The transparent metal layer TCO may be a layer to increase adhesion with a first contact electrode CTE1 and the second contact electrode CTE2 of the light emitting element EL. The transparent metal layer PDE may be formed from a transparent conductive oxide, such as indium tin oxide (ITO) and/or indium zinc oxide (IZO).

The protective film PVX1 may be disposed on the anode pad electrode APD, cathode pad electrode CPD, and transparent metal layer PDE. The protective film PVX1 may be disposed to cover the edges of the anode pad electrode APD, the cathode pad electrode CPD, and the transparent metal layer PDE. The protective film PVX1 may be formed of an inorganic film, such as a silicon nitride layer, a silicon oxynitride layer, a silicon oxide layer, a titanium oxide layer, and/or an aluminum oxide layer.

The light emitting element EL is a flip chip type micro LED in which the first contact electrode CTE1 and the second contact electrode CTE2 are disposed to face the anode pad electrode APD and the cathode pad electrode CPD. The light emitting element EL may be an inorganic light emitting element made of an inorganic material such as GaN. The light emitting element EL may have a length of several to hundreds of μm in the first direction DR1, the second direction DR2, and the third direction DR3. For example, each of the lengths of the light emitting element EL in the first direction DR1, in the second direction DR2, and in the third direction DR3 may be about 100 μm or less.

The light emitting elements EL may be formed by being grown on a semiconductor substrate such as a silicon wafer. Each of the light emitting elements EL may be transferred directly from the silicon wafer onto the anode pad electrode APD and the cathode pad electrode CPD of the substrate SUB. Alternatively, each of the light emitting elements EL may be transferred to the anode pad electrode APD and the cathode pad electrode CPD of the substrate SUB through an electrostatic method using an electrostatic head or a stamp method using an elastic polymer material such as PDMS or silicon as a transfer substrate.

Each of the light emitting elements EL may be a light emitting structure including a base substrate SPUB, an n-type semiconductor NSEM, an active layer MQW, a p-type semiconductor PSEM, a first contact electrode CTE1, and a second contact electrode CTE2.

The base substrate SPUB may be a sapphire substrate, but the present disclosure is not limited thereto.

The n-type semiconductor NSEM may be disposed on one surface of the base substrate SPUB. For example, the n-type semiconductor NSEM may be disposed on the lower surface of the base substrate SPUB. The n-type semiconductor NSEM may be made of GaN doped with an n-type conductivity-type dopant such as Si, Ge, and/or Sn.

The active layer MQW may be disposed on a portion of one surface of the n-type semiconductor NSEM. The active layer may include a material having a single or multiple quantum well structure. When the active layer contains a material having a multiple quantum well structure, the active layer may have the structure in which a plurality of well layers and barrier layers are alternately laminated. In this case, the well layer may be formed of InGaN, and the barrier layer may be formed of GaN or AlGaN, but is not limited thereto. Alternatively, the active layer may have a structure in which semiconductor materials having large band gap energy and semiconductor materials having small band gap energy are alternately stacked, and may include other Group III to Group V semiconductor materials according to a wavelength band of the emitted light.

The p-type semiconductor PSEM may be disposed on one surface of the active layer MQW. The p-type semiconductor PSEM may be made of GaN doped with a p-type conductivity-type dopant such as Mg, Zn, Ca, Se, and/or Ba.

The first contact electrode CTE1 may be disposed on the p-type semiconductor PSEM, and the second contact electrode CTE2 may be disposed on another portion of one surface of the n-type semiconductor NSEM. Another portion of one surface of the n-type semiconductor NSEM on which the second contact electrode CTE2 is disposed may be spaced from a portion of one surface of the n-type semiconductor NSEM on which the active layer MQW is disposed.

The first contact electrode CTE1 and the anode pad electrode APD may be adhered to each other through the conductive adhesive such as an anisotropic conductive film ACF and/or an anisotropic conductive paste ACP. Alternatively, the first contact electrode CTE1 and/or the anode pad electrode APD may be bonded to each other through a soldering process.

A distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance adjusting layer 52.

The adhesive member 51 of the first front cover COV1 serves to attach the light emitting element layer EML of the first display module DPM1 and the first front cover COV1. The adhesive member 51 of the second front cover COV2 serves to attach the light emitting element layer of the second display module DPM2 and the second front cover COV2. The adhesive member 51 may be a transparent adhesive member capable of transmitting light. For example, the adhesive member 51 may be an optically clear adhesive film or an optically clear resin.

The anti-glare layer 53 may be designed to diffusely reflect external light to prevent deterioration in visibility of an image by reflecting external light as it is. Accordingly, the contrast ratio of images displayed by the first display device 10 and the second display device 20 may be increased due to the anti-glare layer 53.

A light transmittance adjusting layer 52 may be designed to reduce transmittance of external light or light reflected from the first display module DPM1 and the second display module DPM2. Accordingly, it is possible to prevent the gap GSUB between the substrate SUB of the first display module DPM1 and the substrate SUB of the second display module DPM2 from being visually recognized from the outside.

The anti-glare layer 53 may be implemented as a polarizing plate, and the light transmittance control layer 52 may be implemented as a phase retardation layer, but the present disclosure is not limited thereto.

Because an example of the tiled display device cut along the lines O-O', P-P', and Q-Q' of FIG. 19 is substantially the same as an example of the tiled display device cut along N-N' described in conjunction with FIG. 20, a description thereof is omitted.

It should be understood, however, that the aspects and features of embodiments of the present disclosure are not restricted to the one set forth herein. The above and other aspects of the present disclosure will become more apparent to one of ordinary skill in the art to which the present disclosure pertains by referencing the claims, with equivalents thereof to be included therein.

What is claimed is:

1. A display device comprising:
    pulse width modulation (PWM) data lines configured to receive PWM data voltages;
    first to third data lines configured to receive corresponding data voltages from among first to third data voltages;
    sweep signal lines configured to receive sweep signals; and
    a sub-pixel connected to a PWM data line from among the PWM data lines, a data line from among the first to third data lines, and a sweep signal line from among the sweep signal lines, and comprises at least one light emitting element,
    wherein the sub-pixel further comprises:
        a first transistor;
        a first capacitor electrode connected to a gate electrode of the first transistor; and
        a second capacitor electrode connected to the sweep signal line, and overlapping the first capacitor electrode in a thickness direction of the display device,
        wherein the second capacitor electrode does not overlap a source electrode and a drain electrode of the first transistor in the thickness direction of the display device.

2. The display device of claim 1, wherein the sweep signal comprises a pulse that is configured to linearly change from a gate-off voltage to a gate-on voltage for a period.

3. The display device of claim 1, wherein the sweep signal lines extend in a first direction, and
    wherein a length of the second capacitor electrode in the first direction is greater than a length of the first capacitor electrode in the first direction.

4. The display device of claim 1, wherein a first side of the second capacitor electrode protrudes more than a first side of the first capacitor electrode, and a second side of the second capacitor electrode opposite the first side of the second capacitor electrode protrudes more than a second side of the first capacitor electrode opposite the first side of the first capacitor electrode.

5. The display device of claim 1, wherein the sweep signal lines extend in a first direction, and
    wherein a length of the second capacitor electrode in the first direction is smaller than a length of the first capacitor electrode in the first direction.

6. The display device of claim 1, wherein a first side of the first capacitor electrode protrudes more than a first side of the second capacitor electrode, and a second side of the first capacitor electrode opposite the first side of the first capacitor electrode protrudes more than a second side of the second capacitor electrode opposite the first side of the second capacitor electrode.

7. The display device of claim 1, further comprising PWM light emitting lines configured to receive PWM light emitting signals,
    wherein the second capacitor electrode overlaps with one of the PWM light emitting lines in the thickness direction of the display device.

8. The display device of claim 7, further comprising a first gate connection electrode and a second gate connection electrode connected to the PWM light emitting line and spaced from each other,
    wherein the sweep signal lines extend in a first direction, and
    wherein the second capacitor electrode is between the first gate connection electrode and the second gate connection electrode in the first direction.

9. The display device of claim 1, wherein the sub-pixel further comprises a third capacitor electrode connected to the gate electrode of the first transistor and overlapping the second capacitor electrode in the thickness direction of the display device.

10. The display device of claim 9, wherein the second capacitor electrode is between the first capacitor electrode and the third capacitor electrode in the thickness direction of the display device.

11. The display device of claim 9, wherein the sub-pixel further comprises a first sub-transistor and a second sub-transistor connecting the gate electrode and a second electrode of the first transistor when a scan write signal is applied,
    wherein one electrode of the first sub-transistor is connected to the second capacitor electrode, and
    wherein one electrode of the second sub-transistor is connected to a first drain electrode of the first transistor.

12. The display device of claim 9, wherein the sweep signal lines extend in a first direction, and
    wherein a length of the second capacitor electrode in the first direction is greater than a length of the third capacitor electrode in the first direction.

13. The display device of claim 9, wherein a first side of the second capacitor electrode protrudes more than a first side of the third capacitor electrode, and a second side of the second capacitor electrode opposite the first side of the second capacitor electrode protrudes more than a second side of the third capacitor electrode facing the first side.

14. The display device of claim 9, wherein the sweep signal lines extend in a first direction, and
    wherein a length of the second capacitor electrode in the first direction is smaller than a length of the third capacitor electrode in the first direction.

15. The display device of claim 9, wherein a first side of the third capacitor electrode protrudes more than a first side of the second capacitor electrode, and
    wherein a second side of the third capacitor electrode opposite the first side of the third capacitor electrode protrudes more than a second side of the second capacitor electrode opposite the first side of the second capacitor electrode.

16. The display device of claim 9, wherein the light emitting element is a flip chip type micro light emitting diode element.

17. A display device comprising:
pulse width modulation (PWM) data lines configured to receive PWM data voltages;
first to third data lines configured to receive corresponding data voltages from among first to third data voltages;
sweep signal lines configured to receive sweep signals; and
a sub-pixel connected to a PWM data line from among the PWM data lines, a data line from among the first to third data lines, and a sweep signal line from among the sweep signal lines, and comprises at least one light emitting element,
wherein the sub-pixel further comprises:
 a first transistor;
 a first capacitor electrode connected to a gate electrode of the first transistor;
 a second capacitor electrode connected to the sweep signal line and overlapping the first capacitor electrode in a thickness direction of the display device; and
 a third capacitor electrode connected to the gate electrode of the first transistor.

18. The display device of claim 17, wherein the gate electrode of the first transistor and the first capacitor electrode are integrally formed.

19. The display device of claim 17, wherein the second capacitor electrode does not overlap a source electrode and a drain electrode of the first transistor in the thickness direction of the display device.

20. A tiled display device comprising:
a plurality of display devices; and
a connection member between the plurality of display devices,
wherein a display device from among the plurality of display devices comprises:
 pulse width modulation (PWM) data lines configured to receive PWM data voltages;
 first to third data lines configured to receive corresponding data voltages from among first to third data voltages;
 sweep signal lines configured to receive sweep signals are respectively applied; and
 a sub-pixel connected to a PWM data line from among the PWM data lines, a data line from among the first to third data lines, and a sweep signal line from among the sweep signal lines, and comprises at least one light emitting element,
 wherein the sub-pixel comprises:
  a first transistor;
  a first capacitor electrode connected to a gate electrode of the first transistor; and
  a second capacitor electrode connected to the sweep signal line, and overlapping the first capacitor electrode in a thickness direction of the display device,
 wherein the second capacitor electrode does not overlap a source electrode and a drain electrode of the first transistor in the thickness direction of the display device.

21. The tiled display device of claim 20, wherein the light emitting element is a flip chip type micro light emitting diode element.

22. The tiled display device of claim 20, wherein a substrate of the display device comprises glass.

23. The tiled display device of claim 20, wherein the display device further comprises a side wiring on a first surface of a substrate, a second surface opposite to the first surface, and a side surface between the first surface and the second surface.

24. The tiled display device of claim 23, wherein the display device further comprises:
a connection line on the second surface of the substrate and connected to the side wiring; and
a flexible film connected to the connection line through a conductive adhesive member.

25. The tiled display device of claim 20, wherein the plurality of display devices are arranged in a matrix form in M rows and N columns.

* * * * *